(12) United States Patent
Noda

(10) Patent No.: US 9,929,366 B2
(45) Date of Patent: Mar. 27, 2018

(54) ORGANIC EL ELEMENT, AND ORGANIC EL ELEMENT MANUFACTURING METHOD

(71) Applicant: SUMITOMO CHEMICAL COMPANY, LIMITED, Tokyo (JP)

(72) Inventor: Motoo Noda, Niihama (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 0 days.

(21) Appl. No.: 14/891,427

(22) PCT Filed: May 16, 2014

(86) PCT No.: PCT/JP2014/063086
§ 371 (c)(1),
(2) Date: Nov. 16, 2015

(87) PCT Pub. No.: WO2014/185529
PCT Pub. Date: Nov. 20, 2014

(65) Prior Publication Data
US 2016/0141541 A1     May 19, 2016

(30) Foreign Application Priority Data

May 17, 2013    (JP) ................. 2013-105524

(51) Int. Cl.
*H01L 51/50*     (2006.01)
*H01L 27/32*     (2006.01)
*H01L 51/00*     (2006.01)
*H01L 51/56*     (2006.01)

(52) U.S. Cl.
CPC ...... *H01L 51/5036* (2013.01); *H01L 27/3206* (2013.01); *H01L 27/3239* (2013.01);
(Continued)

(58) Field of Classification Search
CPC . H01L 51/5036; H01L 51/56; H01L 51/0005; H01L 51/5008; H01L 27/3206; H01L 2251/558; H01L 51/50
(Continued)

(56) References Cited

U.S. PATENT DOCUMENTS

2001/0001485 A1    5/2001  Bao et al.
2001/0022496 A1*   9/2001  Kobayashi ............. H01L 27/32
                                                     313/504
(Continued)

FOREIGN PATENT DOCUMENTS

CN       101507355 A     8/2009
EP       0756334 A2      1/1997
(Continued)

OTHER PUBLICATIONS

International Preliminary Report on Patentability issued by the International Bureau in counterpart International application No. PCT/JP2014/063086, dated Nov. 26, 2015.
(Continued)

*Primary Examiner* — Adam S Bowen
(74) *Attorney, Agent, or Firm* — Sughrue Mion, PLLC

(57) ABSTRACT

An organic EL element 1 according to one embodiment of the present invention is an organic EL element comprising: a continuous first electrode 20; a continuous second electrode 70; and a light emitting layer 50 arranged between the first electrode 20 and the second electrode 70, wherein the light emitting layer 50 has two light emitting regions 51, 52 and wherein the two light emitting regions 51, 52 are different in at least one of emission color and emission luminance.

31 Claims, 17 Drawing Sheets

(52) U.S. Cl.
CPC ...... *H01L 51/0005* (2013.01); *H01L 51/5008* (2013.01); *H01L 51/50* (2013.01); *H01L 51/56* (2013.01); *H01L 2251/558* (2013.01)

(58) Field of Classification Search
USPC .......................................................... 257/40
See application file for complete search history.

(56) References Cited

U.S. PATENT DOCUMENTS

| | | | | |
|---|---|---|---|---|
| 2002/0089282 | A1* | 7/2002 | Kijima | ............... H01L 51/0052 313/506 |
| 2003/0184218 | A1 | 10/2003 | Brost et al. | |
| 2007/0241665 | A1 | 10/2007 | Sakanoue et al. | |
| 2009/0273616 | A1* | 11/2009 | Loebl | .................. H01L 51/5036 345/690 |
| 2011/0042691 | A1* | 2/2011 | Hayata | ............... H01L 51/0005 257/88 |

FOREIGN PATENT DOCUMENTS

| | | |
|---|---|---|
| EP | 2296442 A1 | 3/2011 |
| JP | 2001-35669 A | 2/2001 |
| JP | 2001-313172 A | 11/2001 |
| JP | 2003297577 A | 10/2003 |
| JP | 2007-200626 A | 8/2007 |
| JP | 2007-287586 A | 11/2007 |
| JP | 2010-500731 A | 1/2010 |
| JP | 2013-93426 A | 5/2013 |
| WO | 2006087654 A1 | 8/2006 |
| WO | 2008020396 A1 | 2/2008 |
| WO | 2009/144912 A1 | 12/2009 |

OTHER PUBLICATIONS

Communication dated Aug. 3, 2016, from the State Intellectual Property Office of the P.R.C. in counterpart Chinese application No. 201480028259.5.
Communication dated Nov. 28, 2016, from the European Patent Office in counterpart European Application No. 14798545.1.
International Search Report dated Aug. 19, 2014, issued by the International Bureau in corresponding International Application No. PCT/JP2014/063086.
Communication dated Aug. 30, 2016, issued by the Japan Patent Office in corresponding Japanese Application No. 2015-517146.

* cited by examiner (a)           (b)           (c)

| | LIGHT EMITTING REGION 52 (BACKGROUND PART) BLUE INK | | | LIGHT EMITTING REGION 51 (ROUND PART) YELLOW INK | | | VISIBILITY OF BOUNDARY |
|---|---|---|---|---|---|---|---|
| | CONCENTRATION | VISCOSITY | THICKNESS RIGHT AFTER COATING | CONCENTRATION | VISCOSITY | THICKNESS RIGHT AFTER COATING | |
| EXAMPLE 11 | 1.0% | 8cp | 2.4μm | 0.7% | 5cp | 4.5μm | ◎ |
| REFERENCE EXAMPLE 11 | 1.0% | 8cp | 2.4μm | 0.7% | 5cp | 6.8μm | ○ |
| REFERENCE EXAMPLE 12 | 1.0% | 8cp | 4.8μm | 0.7% | 5cp | 9.1μm | △ |

VISIBILITY OF BOUNDARY:
◎: BRIGHT LINE AND DARK LINE AT BOUNDARY, i.e. FRINGE IS SMALL.
○: BRIGHT LINE AND DARK LINE AT BOUNDARY, i.e. FRINGE IS IMPROVED, BUT INSUFFICIENT.
△: BRIGHT LINE AND DARK LINE AT BOUNDARY, i.e. FRINGE IS LARGE.

Fig.16

| | LIGHT EMITTING REGION 51 (SPIRAL PART) PURPLE INK | | | LIGHT EMITTING REGION 52 (BACKGROUND PART) RED INK | | | VISIBILITY OF BOUNDARY |
|---|---|---|---|---|---|---|---|
| | CONCENTRATION | VISCOSITY | THICKNESS RIGHT AFTER COATING | CONCENTRATION | VISCOSITY | THICKNESS RIGHT AFTER COATING | |
| EXAMPLE 21 | 0.7% | 5cp | 2.8μm | 0.7% | 5cp | 3.8μm | ◎ |
| EXAMPLE 22 | 0.7% | 5cp | 2.8μm | 0.7% | 5cp | 5.1μm | ◎ |
| REFERENCE EXAMPLE 21 | 0.7% | 5cp | 2.8μm | 0.7% | 5cp | 6.4μm | △ |

VISIBILITY OF BOUNDARY:
◎: BRIGHT LINE AND DARK LINE AT BOUNDARY, i.e. FRINGE IS SMALL.
○: BRIGHT LINE AND DARK LINE AT BOUNDARY, i.e. FRINGE IS IMPROVED, BUT INSUFFICIENT.
△: BRIGHT LINE AND DARK LINE AT BOUNDARY, i.e. FRINGE IS LARGE.

Fig.17

| | LIGHT EMITTING REGION 52 (BACKGROUND PART) BLUE INK | | | LIGHT EMITTING REGION 51 (SNOW MARK PART) WHITE INK | | | VISIBILITY OF BOUNDARY |
|---|---|---|---|---|---|---|---|
| | CONCENTRATION | VISCOSITY | THICKNESS RIGHT AFTER COATING | CONCENTRATION | VISCOSITY | THICKNESS RIGHT AFTER COATING | |
| EXAMPLE 31 | 0.8% | 5cp | 3.4μm | 0.7% | 5cp | 4.9μm | ◎ |
| EXAMPLE 32 | 0.8% | 5cp | 3.4μm | 1.4% | 11cp | 1.8μm | ◎ |

VISIBILITY OF BOUNDARY:
◎: BRIGHT LINE AND DARK LINE AT BOUNDARY, i.e. FRINGE IS SMALL.
○: BRIGHT LINE AND DARK LINE AT BOUNDARY, i.e. FRINGE IS IMPROVED, BUT INSUFFICIENT.
△: BRIGHT LINE AND DARK LINE AT BOUNDARY, i.e. FRINGE IS LARGE.

ORGANIC EL ELEMENT, AND ORGANIC EL ELEMENT MANUFACTURING METHOD

CROSS REFERENCE TO RELATED APPLICATIONS

This application is a National Stage of International Application No. PCT/JP2014/063086 filed May 16, 2014, claiming priority based on Japanese Patent Application No. 2013-105524, filed May 17, 2013, the contents of all of which are incorporated herein by reference in their entirety.

TECHNICAL FIELD

The present invention relates to an organic EL element, and an organic EL element manufacturing method.

BACKGROUND ART

Patent Literature 1 discloses an organic EL (Electro Luminescence) element that emits light in a predetermined emission pattern, as a device for expressing a character, a picture, and so on. This organic EL element includes an anode 20, a cathode 40, and an organic light emitting film 30 arranged between these anode 20 and cathode 40, the anode 20 is formed in a wide rough pattern embracing the emission pattern, the cathode 40 is formed in a pattern corresponding to the emission pattern, and the organic light emitting film 30 is formed in a non-patterned continuous surface shape including all of the emission pattern and the respective patterns of the two electrodes. Then the emission pattern corresponding to the pattern of the electrode (specifically, the cathode 40) is obtained in the organic EL element.

CITATION LIST

Patent Literature

Patent Literature 1: Japanese Patent Application Laid-open Publication No. 2001-35669

SUMMARY OF INVENTION

Technical Problem

As described in Patent Literature 1, the photolithography process, etching process, evaporation process, and the like are considered as techniques for forming the electrode in the pattern corresponding to the emission pattern. However, since these techniques necessitate manufacture of a mask corresponding to the electrode pattern (i.e., the emission pattern), the manufacture of mask is needed every change of the emission pattern, so as to make manufacturing cost relatively high.

Therefore, an object of the present invention is to provide an organic EL element and an organic EL element manufacturing method which can achieve simplification and cost reduction of the manufacturing method.

Solution to Problem

An organic EL element of the present invention is an organic EL element comprising: a continuous first electrode; a continuous second electrode; and a light emitting layer arranged between the first electrode and the second electrode, wherein the light emitting layer has a plurality of light emitting regions, and wherein at least two light emitting regions out of the plurality of light emitting regions are different in at least one of emission color and emission luminance.

An organic EL element manufacturing method of the present invention has: a step of forming a continuous first electrode; a step of forming a light emitting layer having a plurality of light emitting regions, at least two light emitting regions out of the plurality of light emitting regions being different in at least one of emission color and emission luminance; and a step of forming a continuous second electrode. The "continuous electrode" herein means a single plate-like electrode which is integrally formed, and means that there is no physical division (i.e., electrical disconnection) made in the integrally formed electrode.

According to the foregoing organic EL element and organic EL element manufacturing method, at least one of emission color and emission luminance is made different for each of the plurality of light emitting regions in the light emitting layer, thereby to form a predetermined emission pattern such as a character or a picture; for this reason, the two electrodes can be formed so as to be continuous and there is no need for forming the electrode in the emission pattern. As a result, there is no need for manufacturing the mask for formation of the electrode in accordance with the emission pattern. For this reason, in forming plural types of emission patterns, there is no need for manufacturing masks for formation of electrodes in accordance with the respective emission patterns, thereby enabling simplification and cost reduction of the manufacturing method.

The foregoing at least two light emitting regions out of the plurality of light emitting regions may be different in light emitting materials contained in the light emitting layer in the respective light emitting regions.

The foregoing step of forming the light emitting layer may comprise, with respect to at least two light emitting regions out of the plurality of light emitting regions, applying coating liquids containing respective different light emitting materials in respective patterns to the respective light emitting regions to form coating films in patterns; and solidifying the coating films to form the light emitting layer in each of the light emitting regions.

According to this, the emission color is made different for each of the plurality of light emitting regions in the light emitting layer, whereby the predetermined emission pattern such as a character or a picture can be formed.

The light emitting layer in a boundary region between adjacent light emitting regions out of the plurality of light emitting regions may contain a light emitting material contained in the light emitting layer in one light emitting region of the adjacent light emitting regions and a light emitting material contained in the light emitting layer in the other light emitting region of the adjacent light emitting regions.

The foregoing step of forming the light emitting layer may comprise, in a boundary region between adjacent light emitting regions out of the plurality of light emitting regions, applying a coating liquid containing a light emitting material for the light emitting layer in one light emitting region of the adjacent light emitting regions and applying a coating liquid containing a light emitting material for the light emitting layer in the other light emitting region of the adjacent light emitting regions.

For example, when the light emitting layer is formed by use of an coating method, a boundary between adjacent light emitting regions can blur due to wetting and spreading of a coating liquid (e.g., ink containing a light emitting material). In this regard, the inventors of the present invention discovered that, in applying coating liquids to respective adjacent light emitting regions, when the coating liquids for the respective light emitting regions were applied with an overlap at a boundary between the adjacent light emitting regions, the blur at the boundary between these light emitting regions could be suppressed, so as to improve visibility. It seems that the reason for it is that the light emitting layer at the boundary between the adjacent light emitting regions becomes thicker to form a contour with a lowered emission luminance, or, to form a contour in a dark emission color by combination of emission colors at the boundary between the adjacent light emitting regions, whereby the boundary between them looks sharp.

According to this, the use of the foregoing coating method results in making the boundary region between the adjacent light emitting regions contain the both light emitting materials for the respective adjacent light emitting regions, whereby the blur at the boundary between these light emitting regions can be suppressed, so as to improve the visibility.

The light emitting layer in a boundary region between adjacent light emitting regions out of the plurality of light emitting regions may be even thinner than the thinner light emitting layer out of the light emitting layer in one light emitting region of the adjacent light emitting regions and the light emitting layer in the other light emitting region of the adjacent light emitting regions.

In the step of forming the light emitting layer, a coating liquid containing a light emitting material may not be applied in a boundary region between adjacent light emitting regions out of the plurality of light emitting regions According to this, the light emitting layer becomes thinner at the boundary between the adjacent light emitting regions, whereby a contour is formed with a high emission luminance, or, a contour with a light emission color is formed by combination of emission colors at the boundary between the adjacent light emitting regions.

The inventors of the present invention discovered that a three-dimensional visual effect was achieved by intentionally shifting an emission pattern at a predetermined position. For example, in a case where there are a first light emitting region and a second light emitting region surrounding it, when the first light emitting region is shifted in a predetermined shift direction, there is an overlap between the first light emitting region and the second light emitting region on one side in the shift direction, while there appears a gap between the first light emitting region and the second light emitting region on the other side in the shift direction. In this case, it seems that the three-dimensional visual effect is achieved for the following reasons:

(i) on the one side in the shift direction, as described above, the light emitting layer at the boundary between the adjacent light emitting regions becomes thicker to form a contour with a lowered emission luminance, or, to form a contour in a dark emission color by combination of emission colors at the boundary between the adjacent light emitting regions; and (ii) on the other side in the shift direction, conversely, the light emitting layer at the boundary between the adjacent light emitting regions becomes thinner to form a contour with a high emission luminance, or, to form a contour in a light emission color by combination of the emission colors at the boundary between the adjacent light emitting regions.

According to this, the use of the foregoing coating method results in forming a contour with a reduced emission luminance or a contour in a dark color in the boundary region between the adjacent light emitting regions on the one side in the shift direction and forming a contour with a high emission luminance or a contour in a light emission color in the boundary region between the adjacent light emitting regions on the other side in the shift direction, thereby achieving the three-dimensional visual effect.

The aforementioned at least two light emitting regions out of the plurality of light emitting regions may be different in thicknesses of the light emitting layer in the respective light emitting regions.

The aforementioned step of forming the light emitting layer may comprise, with respect to at least two light emitting regions out of the plurality of light emitting regions, applying coating liquids containing respective light emitting materials in different coating amounts so that thicknesses of the light emitting layer in the respective light emitting regions are different.

Since the electric resistance increases as the thickness of the light emitting layer becomes larger, an electric current becomes less likely to flow, so as to lower the emission luminance. Therefore, according to this, the emission luminance is made different for each of the plurality of light emitting regions in the light emitting layer, whereby the predetermined pattern such as a character or a picture can be formed.

The aforementioned organic EL element may further comprise: a function layer arranged between the first electrode and the second electrode and being different from the light emitting layer, and at least two light emitting regions out of the plurality of light emitting regions may be different in thicknesses of the function layer corresponding to the respective light emitting regions.

The aforementioned organic EL element manufacturing method may further have a step of forming a function layer different from the light emitting layer, between the first electrode and the second electrode, and the step of forming the function layer may comprise, with respect to at least two light emitting regions out of the plurality of light emitting regions, applying a coating liquid containing a material constituting the function layer in different coating amounts so that thicknesses of the function layer corresponding to the respective light emitting regions are different, to form a coating film; and solidifying the coating film to form the function layer.

In the function layer except for the light emitting layer, since the electric resistance increases as the thickness becomes larger, an electric current becomes less likely to flow, so as to lower the emission luminance. According to this, the emission luminance is made different for each of the plurality of light emitting regions in the light emitting layer, whereby the predetermined pattern such as a character or a picture can be formed.

The foregoing light emitting layer may further have a non-light-emitting region, the non-light-emitting region may be formed by applying two types of coating liquids, one of the two types of coating liquids may be the same as the coating liquid for the light emitting layer in the light emitting region adjacent to the non-light-emitting region out of the plurality of light emitting regions, and the other of the two types of coating liquids may contain the same light emitting material as the light emitting material of the coating liquid for the light emitting layer in the light emitting region adjacent to the non-light-emitting region, or, contain a non-light-emitting material, and have a larger viscosity than the coating liquid for the light emitting layer in the light emitting region adjacent to the non-light-emitting region.

The foregoing step of forming the light emitting layer may include a sub-step of forming a non-light-emitting region in the light emitting layer, and the sub-step of forming the non-light-emitting region may comprise: applying a coating liquid which contains the same light emitting material as the light emitting material of the coating liquid for the light emitting layer in the light emitting region adjacent to the non-light-emitting region out of the plurality of light emitting regions, or, which contains a non-light-emitting material, and which has a larger viscosity than the coating liquid for the light emitting layer in the light emitting region adjacent to the non-light-emitting region; and thereafter applying the same coating liquid as the coating liquid for the light emitting layer in the light emitting region adjacent to the non-light-emitting region.

Conventionally, the other of the two types of coating liquids contained the light emitting material which has the same viscosity as the coating liquid for the light emitting layer in the light emitting region adjacent to itself and which is different from the light emitting material of the coating liquid for the light emitting layer in the light emitting region adjacent to itself. In this conventional form, the thickness of the coating liquid for the light emitting layer in the light emitting region adjacent to itself becomes smaller in the edge part of the other of the two types of coating liquids and, as a result, a region around the non-light-emitting region emitted light in the color of the light emitting material contained in the other of the two types of coating liquids in certain cases.

According to this, the other of the two types of coating liquids in the non-light-emitting region is of the same color as the coating liquid in the light emitting region adjacent to itself, or, of the non-light-emitting material; first of all, the edge part looks black even with emission thereof, and in addition, since it has the larger viscosity than the coating liquid for the light emitting layer in the light emitting region adjacent to itself, the blur due to flowage of ink can be reduced, so as to provide a sharp non-light-emitting region.

In a boundary region between adjacent light emitting regions out of the plurality of light emitting regions, the light emitting layer in one light emitting region of the adjacent light emitting regions may be in contact with the light emitting layer in the other light emitting region of the adjacent light emitting regions.

The step of forming the light emitting layer may comprise, with respect to a boundary region between adjacent light emitting regions out of the plurality of light emitting regions, applying a coating liquid so that the light emitting layer in one light emitting region of the adjacent light emitting regions is in contact with the light emitting layer in the other light emitting region of the adjacent light emitting regions.

According to this, the light emitting layer can be formed without forming a barrier (bank) or the like at the boundary between the adjacent light emitting regions, i.e., without use of a technique using a mask (photolithography, etching, evaporation, or the like), and, therefore, it enables further simplification and cost reduction of the manufacturing method.

The step of forming the light emitting layer may comprise: applying a coating liquid containing a light emitting material to form a coating film in a film thickness of not less than 1 μm and not more than 6 μm before solidification; and solidifying the coating film to form the light emitting layer. Similarly, the step of forming the function film may comprise; applying a coating liquid containing a material constituting the function layer to form a coating film in a film thickness of not less than 1 μm and not more than 6 μm before solidification; and solidifying the coating film to form the function layer.

In the thin film forming process of applying and solidifying the coating liquid, the film thickness of the peripheral portion (end portion) of the thin film after solidification may be subjected to film thickness variation (increase of thickness/decrease of thickness) relative to the film thickness of the central portion (coffee stain phenomenon). Describing it in more detail, it is considered that the coating liquid in the peripheral portion of the coating film, which has undergone wetting and spreading, flows back toward the central portion during the drying, whereby the extreme peripheral part decreases its thickness, while the inside part thereof increases its thickness. The thickness-decreased part becomes a bright line and the thickness-increased part becomes a dark line, whereby the boundary between the two light emitting regions comes to be visually recognized as a blurred fringe due to the bright line and dark line.

According to this, however, the film thickness of the coating film upon applying the coating liquid (before the solidification of the coating film) is made thin, not less than 1 μm and not more than 6 μm, thereby suppressing constriction of the coating liquid from the peripheral portion toward the central portion during the drying and suppressing a recession from the end of the coating position. Therefore, the film thickness of the peripheral portion (end portion) of the thin film after the solidification can be suppressed from being subjected to the film thickness variation (thickness increase/thickness decrease) relative to the film thickness of the central portion. As a result, the appearance of the fringe can be suppressed at the boundary between the two light emitting regions, so as to improve the visibility.

The step of forming the light emitting layer may comprise; applying a coating liquid with a viscosity of not less than 7 cp and not more than 20 cp containing a light emitting material to form a coating film; and solidifying the coating film to form the light emitting layer. Similarly, the step of forming the function layer may comprise; applying a coating liquid with a viscosity of not less than 7 cp and not more than 20 cp containing a material constituting the function layer to form a coating film; and solidifying the coating film to form the function layer.

According to this, the viscosity of the coating liquid is made high, not less than 7 cp and not more than 20 cp, whereby the coating liquid can be suppressed from flowing from the peripheral portion toward the central portion during the drying, so as to suppress the recession from the end of the coating position and more suppress appearance of a bulge (thickness increase) in the peripheral part. Therefore, the film thickness of the peripheral portion (end portion) of the thin film after the solidification can be suppressed from being subjected to the film thickness variation (thickness increase/thickness decrease) relative to the film thickness of the central part. As a result, a fringe can be suppressed from appearing at the boundary between the two light emitting regions, so as to improve the visibility.

A method for applying the foregoing coating liquid may be an inkjet printing method.

Since the ink can be readily applied at a desired position with extremely high accuracy with the use of the inkjet printing method, the light emitting layer or the like can be readily formed in an extremely accurate pattern.

Advantageous Effects of Invention

The present invention enables simplification and cost reduction of the manufacturing method.

BRIEF DESCRIPTION OF DRAWINGS

FIG. 15 shows the photographing results of light emission surfaces upon light emission of Example 11, and Reference Examples 11 and 12.

FIG. 16 shows the photographing results of light emission surfaces upon light emission of Examples 21 and 22, and Reference Example 21.

FIG. 17 shows the photographing results of light emission surfaces upon light emission of Examples 31 and 32.

DESCRIPTION OF EMBODIMENTS

Figure 1:
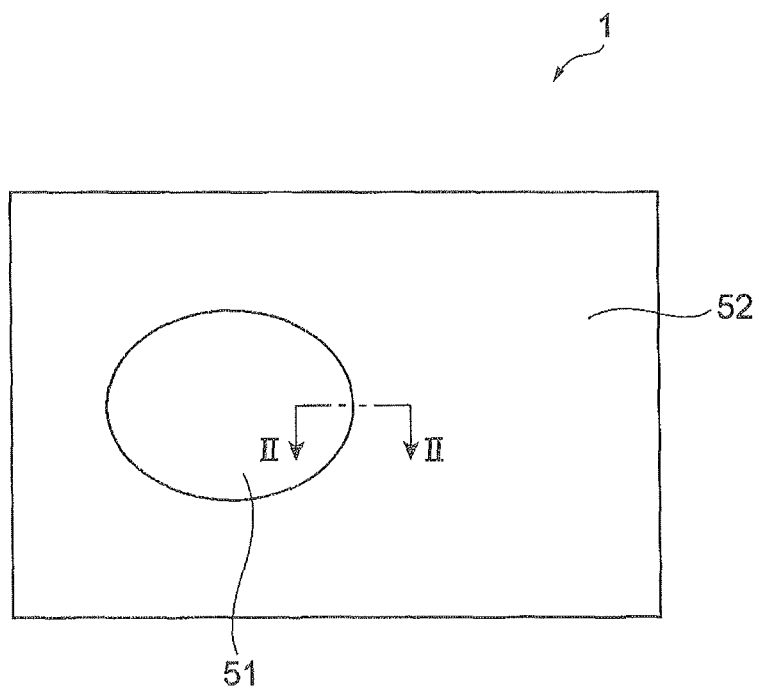
FIG. 1 is a view from the light emission surface side of an organic EL element according to the first embodiment of the present invention.

Preferred embodiments of the present invention will be described below in detail with reference to the drawings. Identical or equivalent portions shall be denoted by the same reference signs in the drawings.

First Embodiment

Figure 2:
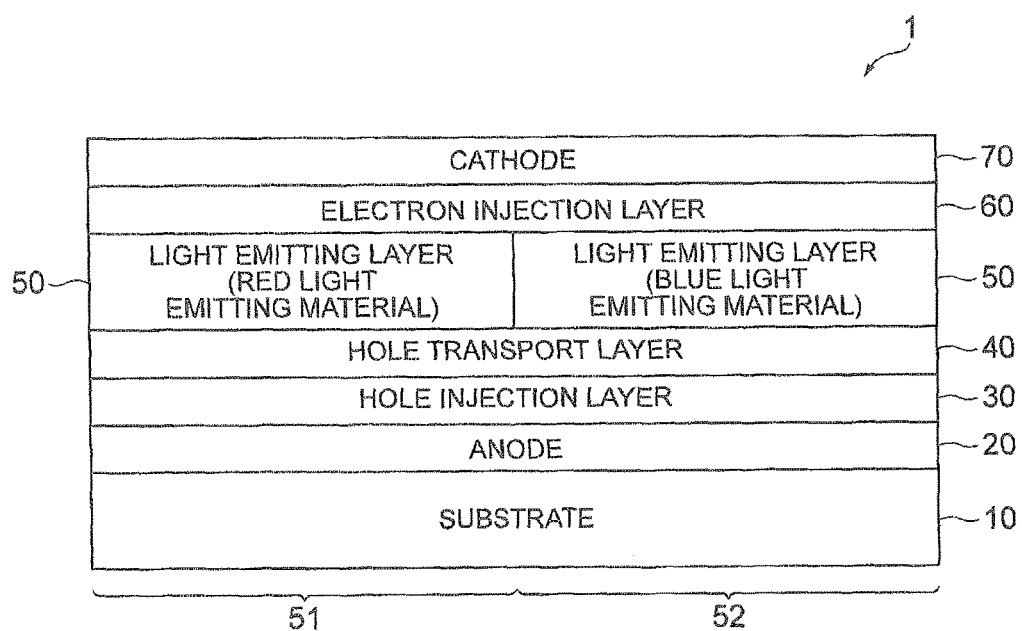
FIG. 2 is an enlarged cross-sectional view along the line II-II of the organic EL element shown in FIG. 1.

FIG. 1 is a view from the light emission surface side of the organic EL element according to the first embodiment of the present invention, and FIG. 2 an enlarged cross-sectional view along the line II-II of the organic EL element shown in FIG. 1.

The organic EL element 1 shown in FIG. 1 and FIG. 2 has an anode (first electrode) 20, a cathode (second electrode) 70, and a light emitting layer 50 provided between these electrodes 20, 70. A predetermined function layer except for the light emitting layer 50 may be provided between the electrodes 20, 70. Examples of such function layers include a hole injection layer, a hole transport layer, an electron injection layer, an electron transport layer, and so on. The below will exemplify a form in which a hole injection layer 30, a hole transport layer 40, and an electron injection layer 60 are provided as function layers.

Specifically, the organic EL element 1 of the present embodiment has a substrate 10, the anode 20 formed on the substrate 10, the hole injection layer 30 formed on the anode 20, the hole transport layer 40 formed on the hole injection layer 30, the light emitting layer 50 formed on the hole transport layer 40, the electron injection layer 60 formed on the light emitting layer 50, and the cathode 70 formed on the electron injection layer 60. In this organic EL element 1, the substrate 10 side is a light emission surface.

Each of the anode 20 and the cathode 70 is formed so as to be continuous. In other words, each of the anode 20 and cathode 70 is integrally formed, so as to be a single plate-like electrode.

The light emitting layer 50 has two light emitting regions 51, 52 and the two light emitting regions 51, 52 are different in light emitting materials of the light emitting layer in the respective light emitting regions. Because of this, the two light emitting regions 51, 52 are different in their emission colors. For example, the light emitting region 51 contains a red light emitting material, whereas the light emitting region 52 contains a blue light emitting material. It is also possible to adopt, for example, a form wherein the light emitting region 51 contains a red light emitting material and a green light emitting material and wherein the light emitting region 52 contains a green light emitting material and a blue light emitting material. Details of each of the color light emitting materials will be described later.

At a boundary between the adjacent light emitting regions 51, 52, the light emitting layer in the light emitting region 51 is in contact with that in the light emitting region 52.

Next, materials and forming methods of the respective layers constituting the organic EL element will be described.

A flexible substrate or a rigid substrate is used as the substrate 10 and, for example, a glass substrate or a plastic substrate or the like is used.

Thin films comprised of a metal oxide, a metal sulfide, a metal, and so on can be used for the anode 20 and specific examples thereof include thin films comprised of indium oxide, zinc oxide, tin oxide, ITO, indium zinc oxide (abbreviated as IZO), gold, platinum, silver, copper, and so on. In the case of the organic EL element in the configuration wherein light emitted from the light emitting layer passes through the anode to emerge out of the element, an electrode exhibiting a light transmitting property is used as the anode 20.

One of the known hole injection materials can be used for the hole injection layer 30. Examples of the hole injection materials include oxides such as vanadium oxide, molybdenum oxide, ruthenium oxide, and aluminum oxide, phenylamines, starburst amines, phthalocyanines, amorphous carbon, polyaniline, polythiophene derivatives, and so on.

One of the known hole transport materials can be used for the hole transport layer 40. Examples of the hole transport materials include polyvinyl carbazole or derivatives thereof, polysilane or derivatives thereof, polysiloxane derivatives having an aromatic amine in a side chain or in the main chain, pyrazoline derivatives, arylamine derivatives, stilbene derivatives, triphenyl diamine derivatives, polyaniline or derivatives thereof, polythiophene or derivatives thereof, polyaryl amine or derivatives thereof, polypyrrole or derivatives thereof, poly(p-phenylene vinylene) or derivatives thereof, poly(2,5-thienylene vinylene) or derivatives thereof, and so on.

The light emitting layer 50 is usually made principally from an organic substance that emits fluorescence and/or phosphorescence, or, from the organic substance and a dopant for helping it. The dopant is added, for example, in order to improve the light emission efficiency or change the emission wavelength. The organic substance contained in the light emitting layer may be a low-molecular-weight compound or a high-molecular-weight compound. Examples of the light emitting materials constituting the light emitting layer include the known pigment-based materials, metal complex-based materials, polymer-based materials, and dopant materials.

Examples of the pigment-based materials include cyclopentamine derivatives, tetraphenylbutadiene derivative compounds, triphenylamine derivatives, oxadiazole derivatives, pyrazoloquinoline derivatives, distyrylbenzene derivatives, distyrylarylene derivatives, pyrrole derivatives, thiophene ring compounds, pyridine ring compounds, perinone derivatives, perylene derivatives, oligothiophene derivatives, oxadiazole dimers, pyrazoline dimers, quinacridone derivatives, coumarin derivatives, and so on.

Examples of the metal complex-based materials include metal complexes having a rare earth metal such as Tb, Eu or Dy, or, Al, Zn, Be, Ir, Pt, or the like as a central metal and an oxadiazole structure, a thiadiazole structure, a phenylpyridine structure, a phenylbenzoimidazole structure, a quinoline structure, or the like as a ligand.

Examples of the polymer-based materials include polyparaphenylene vinylene derivatives, polythiophene derivatives, polyparaphenylene derivatives, polysilane derivatives, polyacetylene derivatives, polyfluorene derivatives, polyvinylcarbazole derivatives, polymers obtained by polymerizing the foregoing pigment-based materials or metal complex-based light emitting materials, and so on.

Among the above-described light emitting materials, examples of materials that emit blue light include distyrylarylene derivatives, oxadiazole derivatives, polymers thereof, polyvinylcarbazole derivatives, polyparaphenylene derivatives, polyfluorene derivatives, and so on.

Examples of materials that emit green light include quinacridone derivatives, coumarin derivatives, polymers thereof, polyparaphenylene vinylene derivatives, polyfluorene derivatives, and so on.

Examples of materials that emit red light include coumarin derivatives, thiophene ring compounds, polymers thereof, polyparaphenylene vinylene derivatives, polythiophene derivatives, polyfluorene derivatives, and so on.

White can be produced by mixing blue, green, and red described above.

Examples of the dopant materials include perylene derivatives, coumarin derivatives, rubrene derivatives, quinacridone derivatives, squarium derivatives, porphyrin derivatives, styryl-based pigments, tetracene derivatives, pyrazolone derivatives, decacyclene, phenoxazone, and so on.

One of the known electron transport materials can be used for the electron transport layer. Examples of the electron transport materials include oxadiazole derivatives, anthraquinodimethane or derivatives thereof, benzoquinone or derivatives thereof, naphthoquinone or derivatives thereof, anthraquinone or derivatives thereof, tetracyanoanthraquinodimethane or derivatives thereof, fluorenone derivatives, diphenyldicyanoethylene or derivatives thereof, diphenoquinone derivatives, metal complexes of 8-hydroxyquinoline or derivatives thereof, polyquinoline or derivatives thereof, polyquinoxaline or derivatives thereof, polyfluorene or derivatives thereof, and so on.

One of the known electron injection materials can be used for the electron injection layer 60. Examples of the electron injection materials include alkali metals, alkaline earth metals, alloys containing at least one of the alkali metals and alkaline earth metals, oxides, halides, and carbonates of the alkali metals or the alkaline earth metals, mixtures of these substances, and so on.

Preferred materials for the cathode 70 are materials that have a low work function to facilitate injection of electrons into the light emitting layer and that have high electric conductivity. In the case of the organic EL element in the configuration where light is taken out from the anode side, preferred materials for the cathode 70 are materials with high reflectance for visible light, in order to allow the cathode to reflect the light emitted from the light emitting layer, toward the anode side. Examples of materials applicable to the cathode 70 include alkali metals, alkaline earth metals, transition metals, and Group 13 metals in the periodic table. It is also possible to use a transparent electrically-conductive electrode made from an electroconductive metal oxide, an electroconductive organic substance, or the like, as the cathode 70.

The foregoing layers and electrodes can be formed by an evaporation method or by an coating method. Examples of coating methods include: coating methods such as spin coating, casting, microgravure coating, gravure coating, bar coating, roll coating, wire bar coating, dip coating, slit coating, capillary coating, spray coating, and nozzle coating; gravure printing; screen printing; flexo printing; offset printing; reverse printing; inkjet printing. When pattern coating is necessary, it is preferred to form a layer or an electrode by a coating method capable of pattern coating and it is particularly preferred to form a layer or an electrode by the inkjet printing method.

There are no particular restrictions on a solvent for ink (coating liquid) to be used in the coating method as long as it can dissolve each material; examples of such solvents include chlorine-based solvents such as chloroform, methylene chloride, and dichloroethane, ether-based solvents such as tetrahydrofuran, aromatic hydrocarbon-based solvents such as toluene and xylene, ketone-based solvents such as acetone and methyl ethyl ketone, ester-based solvents such as ethyl acetate, butyl acetate, and ethyl cellosolve acetate, and water.

Since in the organic EL element 1 of this first embodiment the emission color is made different for each of the light emitting regions 51, 52 in the light emitting layer 50 to form a predetermined emission pattern such as a character or a picture, the electrodes 20, 70 can be formed so as to be continuous, without need for forming the electrodes 20, 70 in the emission pattern. As a result, it becomes unnecessary to manufacture a mask for formation of electrode in accordance with the emission pattern. For this reason, in forming plural types of emission patterns, there is no need for manufacturing masks for formation of electrodes in accordance with the respective emission patterns, and thus it becomes feasible to achieve simplification and cost reduction of the manufacturing method.

It should be noted that the present invention does not exclude the technique using the mask, as a technique for forming the light emitting layer. However, further simplification of manufacturability and cost reduction can be achieved if the light emitting layer 50 is also formed by a technique not using the mask, in other words, if a technique for forming a barrier (bank) or the like with the use of the mask is not used at the boundary between the adjacent light emitting regions 51, 52; i.e, if the light emitting layer 50 is formed so that the light emitting layer in the light emitting region 51 is in contact with the light emitting layer in the light emitting region 52, at the boundary between the adjacent light emitting regions 51, 52.

Second Embodiment

Figure 3:
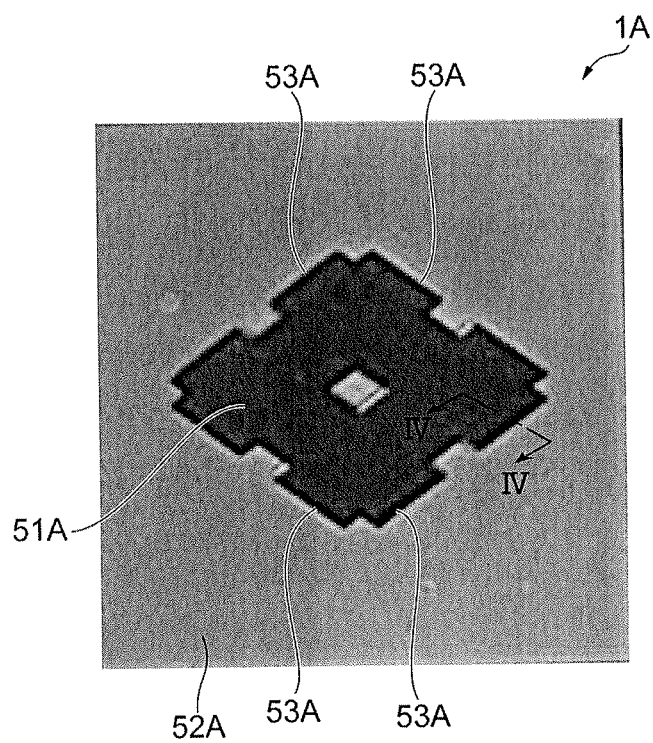
FIG. 3 is a view from the light emission surface side of an organic EL element according to the second embodiment of the present invention.
Figure 4:
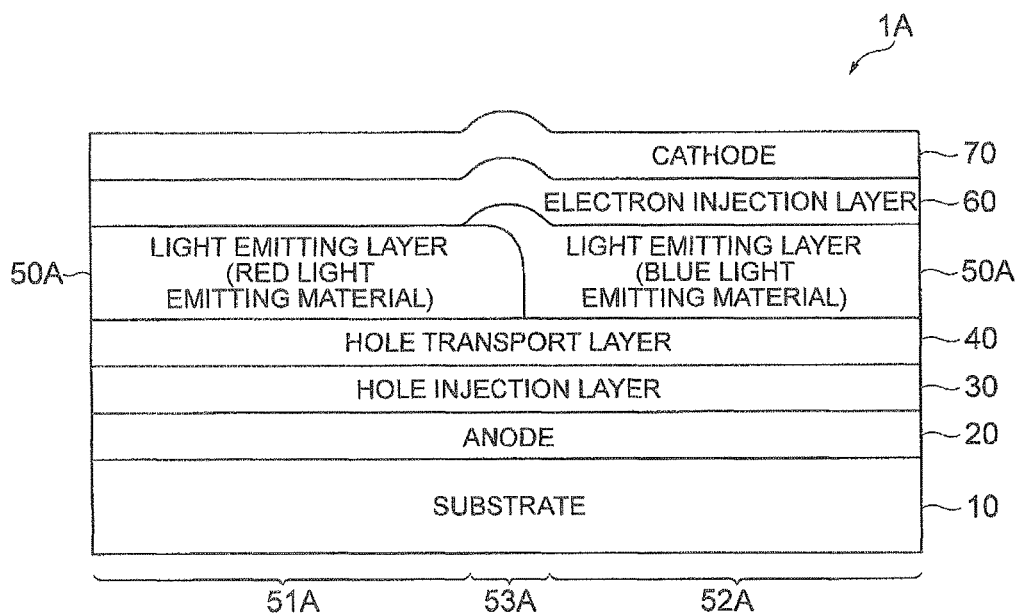
FIG. 4 is an enlarged cross-sectional view along the line IV-IV of the organic EL element shown in FIG. 3.

FIG. 3 is a view from the light emission surface side of the organic EL element according to the second embodiment of the present invention, and FIG. 4 an enlarged cross-sectional view along the line IV-IV of the organic EL element shown in FIG. 3.

The organic EL element 1A shown in FIG. 3 and FIG. 4 is different from the first embodiment in that it has a light emitting layer 50A in place of the light emitting layer 50 in the organic EL element 1.

The light emitting layer 50A has two light emitting regions 51A, 52A and the two light emitting regions 51A, 52A are different in light emitting materials of the light emitting layer in the respective light emitting regions. For this reason, the two light emitting regions 51A, 52A are different in their emission colors. For example, the light emitting region 51A contains a red light emitting material as the light emitting region 51 does, whereas the light emitting region 52A contains a blue light emitting material as the light emitting region 52 does.

As a film formation method for the two light emitting regions 51A, 52A, for example, an ink containing the red light emitting material is applied to the light emitting region 51A and then an ink containing the blue light emitting material is applied to the light emitting region 52A. At this time, coating is implemented based on design such that the inks for the respective light emitting regions overlap in a predetermined width as a designed value, at the boundary between the light emitting region 51A and the light emitting region 52A. This predetermined width is, for example, from 0.05 mm to 15 mm, preferably from 0.1 mm to 2.0 mm, and more preferably from 0.2 mm to 0.5 mm.

This causes the light emitting layer 50A to have a boundary region 53A between the adjacent light emitting regions 51A, 52A and this boundary region 53A comes to contain the light emitting material of the light emitting layer in the light emitting region 51A and the light emitting material of the light emitting layer in the light emitting region 52A.

In the boundary region 53A, depending upon the viscosities of the inks or the like, the light emitting material of the light emitting region 51A and the light emitting material of the light emitting region 52A may be mixed, or, the light emitting material of the light emitting region 51A and the light emitting material of the light emitting region 52A may be stacked in two layers. Furthermore, the thickness of the light emitting layer in the boundary region 53A may be larger than the thickness of the light emitting layer in the light emitting region 51A and the thickness of the light emitting layer in the light emitting region 52A.

The organic EL element 1A of this second embodiment can also achieve the same advantage as the organic EL element 1 of the first embodiment does.

In the meantime, for example, when the light emitting layer is formed by use of the coating method, the boundary between adjacent light emitting regions can blur due to wetting and spreading of the inks (coating liquids). In this regard, the inventors of the present invention discovered that when applying the inks to adjacent light emitting regions was implemented in such a manner that the inks for the respective light emitting regions overlapped each other, the blur at the boundary between these light emitting regions could be suppressed, so as to improve visibility. It seems that the reason for it is that the light emitting layer at the boundary between the adjacent light emitting regions becomes thicker to form a contour with a lowered emission luminance, or, to form a contour in a dark emission color by combination of the emission colors at the boundary between the adjacent light emitting regions, whereby the boundary between them looks sharp.

Since in the organic EL element 1A of the second embodiment the foregoing coating method is used to make the boundary region 53A between the adjacent light emitting regions 51A, 52A contain the both light emitting materials of the light emitting regions 51A, 52A, it can suppress the blur at the boundary between these light emitting regions 51A, 52A, so as to improve the visibility.

Third Embodiment

Figure 5:
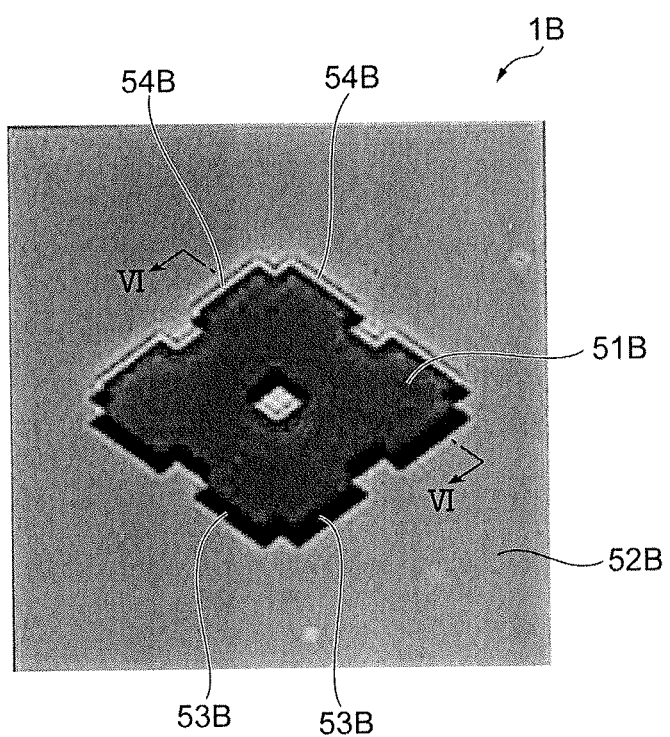
FIG. 5 is a view from the light emission surface side of an organic EL element according to the third embodiment of the present invention.
Figure 6:
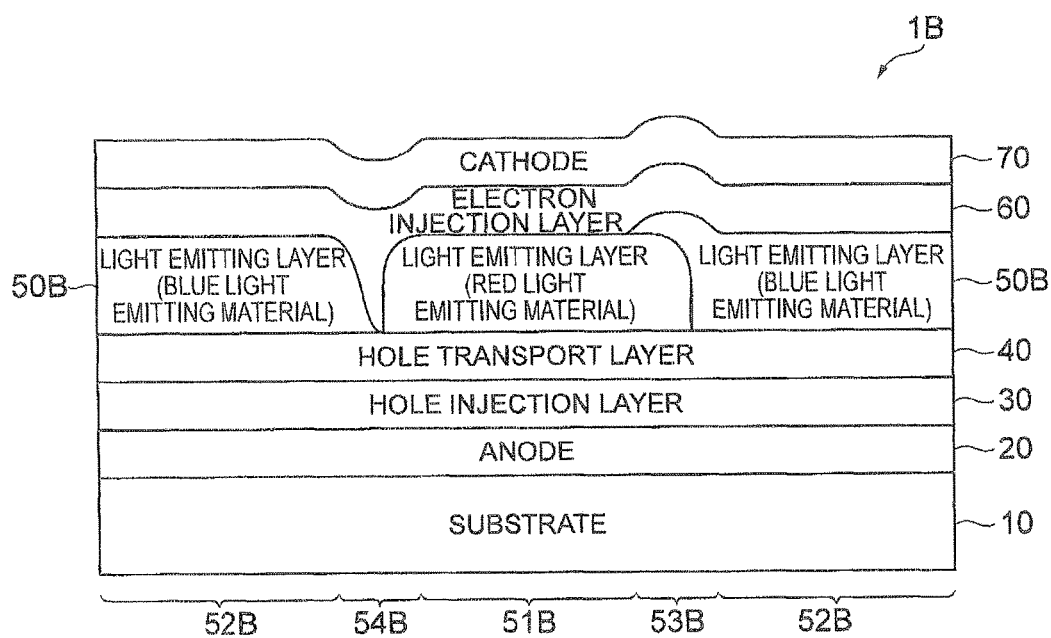
FIG. 6 is an enlarged cross-sectional view along the line VI-VI of the organic EL element shown in FIG. 5.

FIG. 5 is a view from the light emission surface side of the organic EL element according to the third embodiment of the present invention, and FIG. 6 an enlarged cross-sectional view along the line VI-VI of the organic EL element shown in FIG. 5.

The organic EL element 1B shown in FIG. 5 and FIG. 6 is different from the first embodiment in that it has a light emitting layer 50B in place of the light emitting layer 50 in the organic EL element 1.

The light emitting layer 50B has two light emitting regions 51B, 52B and the two light emitting regions 51B, 52B are different in light emitting materials of the light emitting layer in the respective light emitting regions. For this reason, the two light emitting regions 51B, 52B are different in their emission colors. For example, the light emitting region 51B contains a red light emitting material as the light emitting region 51 does, whereas the light emitting region 52B contains a blue light emitting material as the light emitting region 52 does.

As a film formation method for the two light emitting regions 51B, 52B, for example, an ink containing the red light emitting material is applied to the light emitting region 51B and then an ink containing the blue light emitting material is applied to the light emitting region 52B. At this time, the inks are applied in such a manner that the light emitting region 51B is shifted relative to the light emitting region 52B in a direction along the light emission surface.

In the present embodiment, out of the two light emitting regions 51B, 52B, one light emitting region 51B is arranged so as to be surrounded by the other light emitting region 52B. In this case, when the ink corresponding to the one light emitting region 51B is applied so as to be shifted in the direction along the light emission surface, for example, there is an overlap between the one light emitting region 51B and the other light emitting region 52B on one side in the shift direction while there is a gap between the one light emitting region 51B and the other light emitting region 52B on the other side in the shift direction.

For this reason, the inks for the respective light emitting regions are applied so as to overlap, at the boundary between the light emitting region 51B and the light emitting region 52B and boundary in the direction of the shift of the light emitting region 51B relative to the light emitting region 52B. On the other hand, the inks for the respective light emitting regions are not applied in design, at the boundary between the light emitting region 51B and the light emitting region 52B and boundary in the opposite direction to the direction of the shift of the light emitting region 51B relative to the light emitting region 52B, but a thin film could be formed because of flowage of the inks.

This causes the light emitting layer 50B to have a boundary region 53B between the adjacent light emitting regions 51B, 52B and this boundary region 53B comes to contain the light emitting material of the light emitting layer in the light emitting region 51B and the light emitting material of the light emitting layer in the light emitting region 52B. Furthermore, the light emitting layer 50B has a boundary region 54B between the adjacent light emitting regions 51B, 52B and the thickness of the light emitting layer in this boundary region 54B is even thinner than the thickness of the thinner of the light emitting layer in the light emitting region 51B and the light emitting layer in the light emitting region 52B. The thickness of the light emitting layer in this boundary region 54B is preferably not more than 0.7 times an average of the thickness of the light emitting layer in the light emitting region 51B and the thickness of the light emitting layer in the light emitting region 52B and more preferably not more than 0.5 times the average.

In the boundary region 53B, depending upon the viscosities of the inks or the like, the light emitting material of the light emitting region 51B and the light emitting material of the light emitting region 52B may be mixed, or, the light emitting material of the light emitting region 51B and the light emitting material of the light emitting region 52B may be stacked in two layers. Furthermore, the thickness of the light emitting layer in the boundary region 53B may be larger than the thickness of the light emitting layer in the light emitting region 51B and the thickness of the light emitting layer in the light emitting region 52B.

On the other hand, in the boundary region 54B, depending upon the viscosities of the inks or the like, the electron injection layer and the cathode may be present without the light emitting material of the light emitting region 51B and the light emitting material of the light emitting region 52B; alternatively the light emitting material of the light emitting region 51B and the light emitting material of the light emitting region 52B may be present as a thin film.

The organic EL element 1B of this third embodiment can also achieve the same advantage as the organic EL element 1 of the first embodiment does.

In the meantime, the inventors of the present invention discovered that a three-dimensional visual effect was achieved by shifting a predetermined emission pattern relative to a surrounding emission pattern. It seems that the three-dimensional visual effect is achieved for the following reasons:

(i) on the one side in the shift direction, as described above, the light emitting layer at the boundary between the adjacent light emitting regions becomes thicker to form a contour with a lowered emission luminance, or, to form a contour in a dark emission color by combination of the emission colors at the boundary between the adjacent light emitting regions; and (ii) on the other side in the shift direction, conversely, the light emitting layer at the boundary between the adjacent light emitting regions becomes thinner to form a contour with a high emission luminance, or, to form a contour in a light emission color by combination of the emission colors at the boundary between the adjacent light emitting regions.

An amount of the shift is, for example, from 0.05 mm to 15 mm, preferably from 0.1 mm to 2.0 mm, and more preferably from 0.2 mm to 0.5 mm.

The organic EL element 1B of the third embodiment achieves the three-dimensional effect because the use of the aforementioned coating method results in making the boundary region 53B between the adjacent light emitting regions 51B, 52B contain the both light emitting materials of the light emitting regions 51B, 52B and making the boundary region 54B between the adjacent light emitting regions 51B, 52B thinner than the thickness of the light emitting layer in both of the light emitting regions 51B, 52B.

Fourth Embodiment

Figure 7:
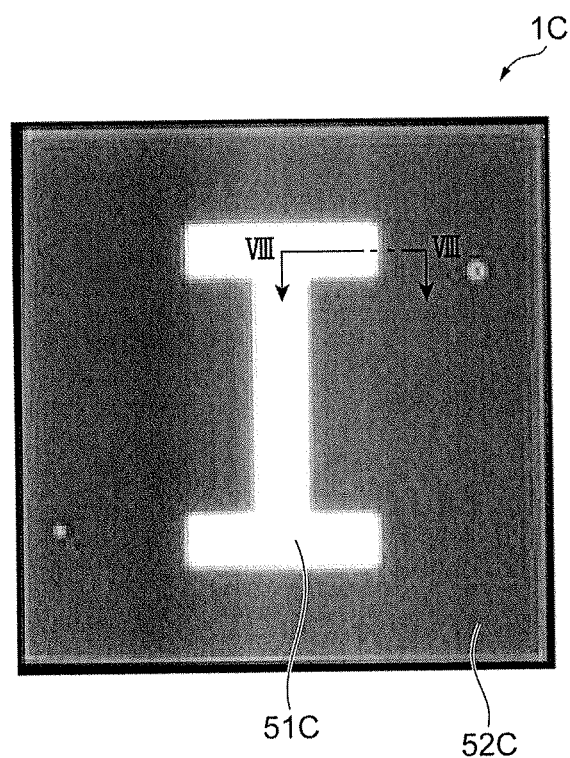
FIG. 7 is a view from the light emission surface side of an organic EL element according to the fourth embodiment of the present invention.
Figure 8:
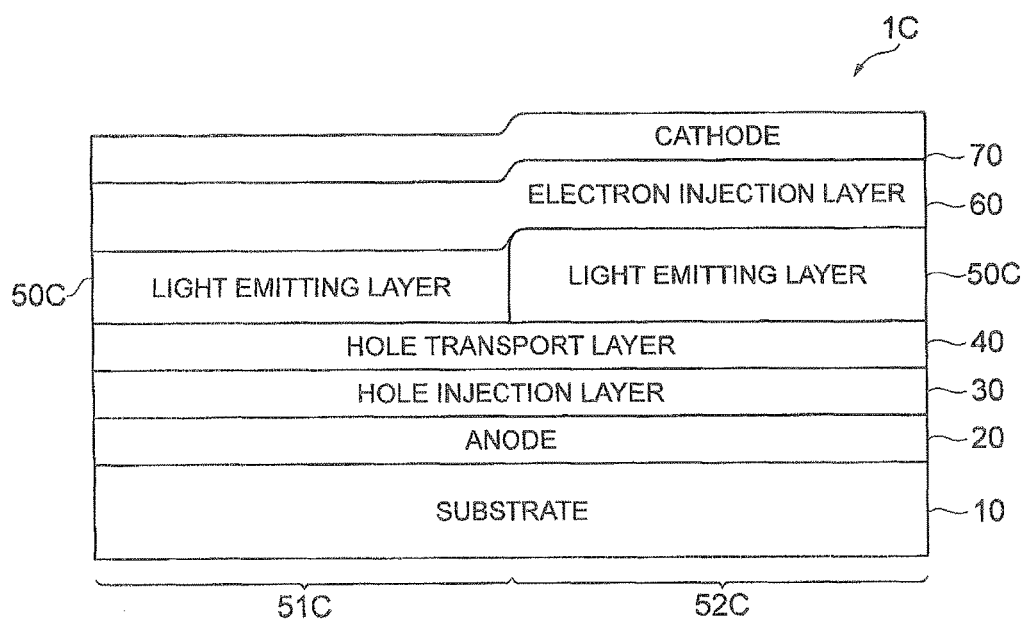
FIG. 8 is an enlarged cross-sectional view along the line VIII-VIII of the organic EL element shown in FIG. 7.

FIG. 7 is a view from the light emission surface side of the organic EL element according to the fourth embodiment of the present invention, and FIG. 8 an enlarged cross-sectional view along the line VIII-VIII of the organic EL element shown in FIG. 7.

The organic EL element 1C shown in FIG. 7 and FIG. 8 is different from the first embodiment in that it has a light emitting layer 50C in place of the light emitting layer 50 in the organic EL element 1.

The light emitting layer 50C has two light emitting regions 51C, 52C and the two light emitting regions 51C, 52C are different in thicknesses of the light emitting layer in the respective light emitting regions. For this reason, the two light emitting regions 51C, 52C are different in their emission luminances. For example, the light emitting region 52C is thicker than the light emitting region 51C. As the thickness of the light emitting region increases, the electric resistance becomes larger and an electric current becomes less likely to flow, so as to make the emission luminance in the light emitting region 52C lower than that in the light emitting region 51C.

Since in the organic EL element 1C of this fourth embodiment the emission luminance is made different for each of the light emitting regions 51C, 52C in the light emitting layer 50 to form a predetermined emission pattern such as a character or a picture, the electrodes 20, 70 can be formed so as to be continuous, without need for forming the electrodes 20, 70 in the emission pattern. As a result, it becomes unnecessary to manufacture a mask for formation of electrode in accordance with the emission pattern. For this reason, in forming plural types of emission patterns, there is no need for manufacturing masks for formation of electrodes in accordance with the respective emission patterns, and thus it becomes feasible to achieve simplification and cost reduction of the manufacturing method.

Fifth Embodiment

Figure 9:
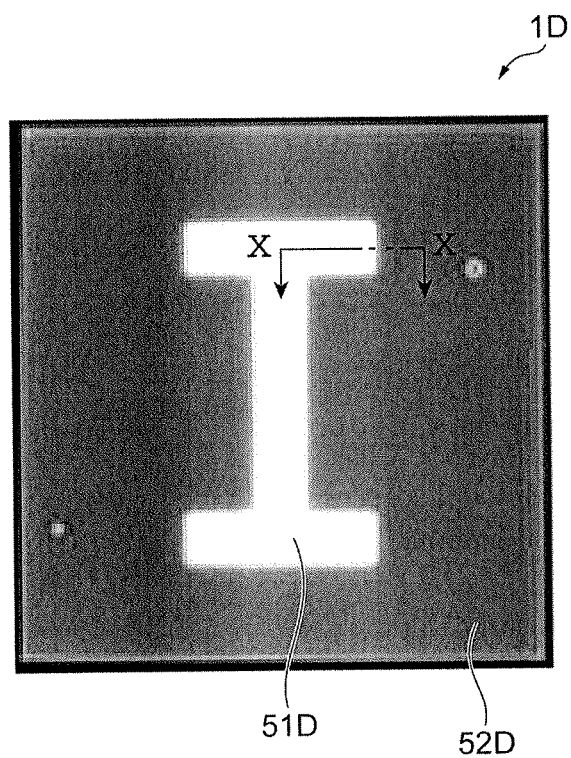
FIG. 9 is a view from the light emission surface side of an organic EL element according to the fifth embodiment of the present invention.
Figure 10:
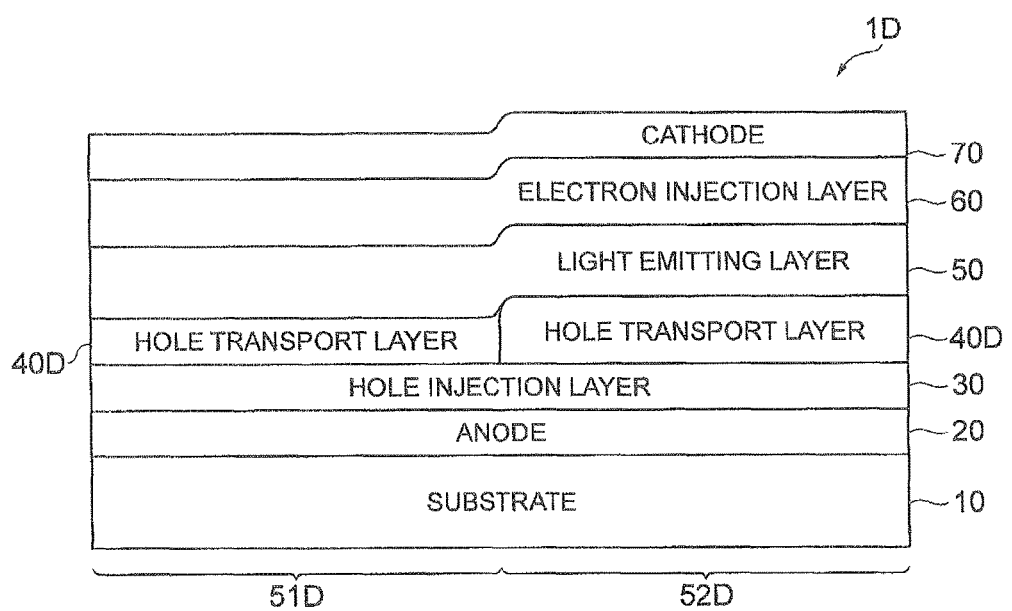
FIG. 10 is an enlarged cross-sectional view along the line X-X of the organic EL element shown in FIG. 9.

FIG. 9 is a view from the light emission surface side of the organic EL element according to the fifth embodiment of the present invention, and FIG. 10 an enlarged cross-sectional view along the line X-X of the organic EL element shown in FIG. 9.

The organic EL element 1D shown in FIG. 9 and FIG. 10 is different from the first embodiment in that it has a hole transport layer 40D in place of the hole transport layer 40 in the organic EL element 1.

In the hole transport layer 40D, the thicknesses of the hole transport layer corresponding to two light emitting regions 51D, 52D are different. For this reason, the two light emitting regions 51D, 52D are different in their emission luminances. For example, the light emitting region 52D is thicker than the light emitting region 51D. In the function layers except for the light emitting layer, the electric resistance becomes larger with increase in thickness and an electric current becomes less likely to flow, so as to make the emission luminance in the light emitting region 52D lower than that in the light emitting region 51D.

The organic EL element 1D of this fifth embodiment has the same advantage as the organic EL element 1C of the fourth embodiment does.

Sixth Embodiment

Figure 11:
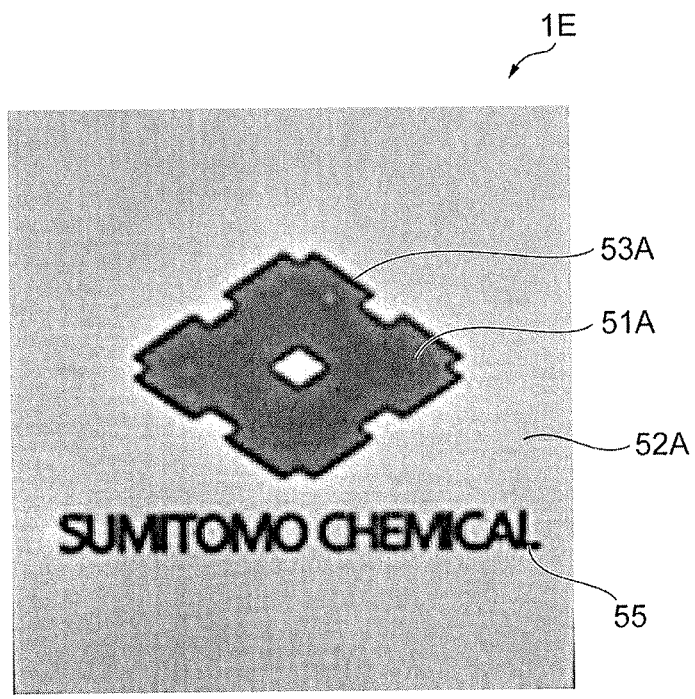
FIG. 11 is a view from the light emission surface side of an organic EL element according to the sixth embodiment of the present invention.
Figure 12:
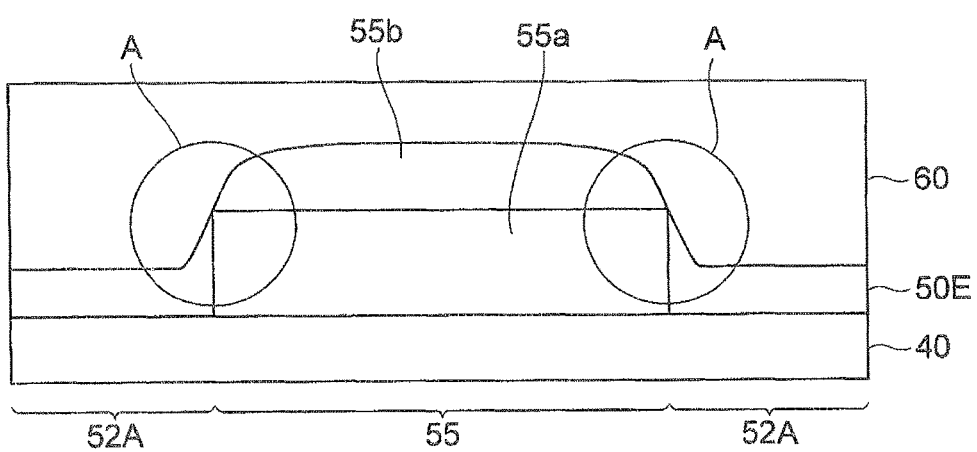
FIG. 12 is a partly enlarged cross-sectional view of a non-light-emitting region shown in FIG. 11.

FIG. 11 is a view from the light emission surface side of the organic EL element according to the sixth embodiment of the present invention, and FIG. 12 a partly enlarged cross-sectional view of a non-light-emitting region shown in FIG. 11.

The organic EL element 1E shown in FIG. 11 and FIG. 12 is different from the second embodiment in that it has a light emitting layer 50E in place of the light emitting layer 50A in the organic EL element 1A.

The light emitting layer 50E further has a non-light-emitting region 55, in addition to the two light emitting regions 51A, 52A and the boundary region 53A between them. The non-light-emitting region 55 is formed by applying two types of inks 55a, 55b in superposition. The ink 55b is the same as the ink applied to the light emitting region 52A adjacent to itself. On the other hand, the ink 55a is an ink that contains the same light emitting material (i.e., the same color) as the ink 55b, or, a non-light-emitting material and that has the larger viscosity than the ink 55b. The viscosity of this ink 55b is from 1 cp to 20 cp, preferably from 2 cp to 10 cp, and more preferably from 2 cp to 5 cp. This makes the thickness of the light emitting layer in the non-light-emitting region 55 larger than the thickness of the light emitting layer in the light emitting region 52A adjacent to itself and, as a result, the emission luminance of the non-light-emitting region 55 becomes very low. This non-light-emitting region 55 is suitably used for black characters or the like.

In passing, conventionally, the ink 55a contained a light emitting material having the viscosity equivalent to that of the ink 55b and being different from the light emitting material of the ink 55b (i.e., in a different color; e.g., the same color as the ink applied to the light emitting region 51). In this conventional form, the thickness of the ink 55b became smaller in edge part A of the ink 55a and, as a result, the region around the non-light-emitting region 55 emitted light in the color of the light emitting material contained in the ink 55a and the blur due to flowage of the ink occurred, so as to result in failure in providing a sharp non-light-emitting region.

Since in the organic EL element 1E of this sixth embodiment the ink 55a in the non-light-emitting region 55 is of the same color as the ink 55b in the light emitting region 52A adjacent to itself or of the non-light-emitting material, the edge part appears black even with emission thereof, first of all, and the ink 55a has the larger viscosity than the ink 55b, so as to reduce the blur due to flowage of the ink, whereby a sharp non-light-emitting region is provided.

Seventh Embodiment

As described in the first embodiment, in the case where the light emitting layer 50 and the function layers 30, 40, and 60 are formed, for example, by the coating method, each layer is formed by applying a coating liquid to form a coating film, and drying this coating film to solidify it, and in the process of drying and solidifying the coating film, the film thickness of the peripheral portion (end portion) may be subjected to film thickness variation (increase of thickness/decrease of thickness) relative to the film thickness of the central portion (coffee stain phenomenon).

Figure 14:
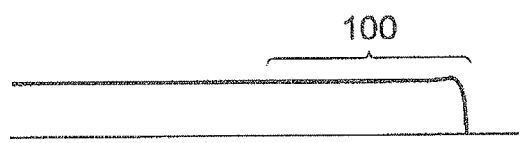
FIG. 14 (a) to (d) are drawings showing (a) a peripheral part of a coating film having undergone wetting and spreading after applying a coating liquid, (b) a peripheral part of a thin film with variation in film thickness during drying and after solidification of the coating film, (c) a boundary between two light emitting regions with variation in film thickness, and (d) a boundary between two light emitting regions with suppression of variation in film thickness, respectively.
Figure 14:
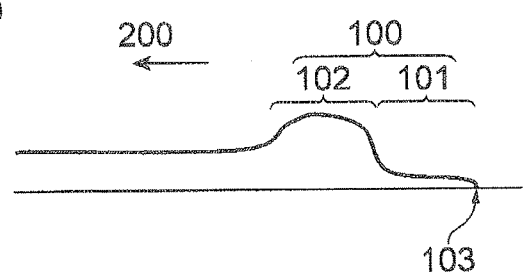
Figure 14:
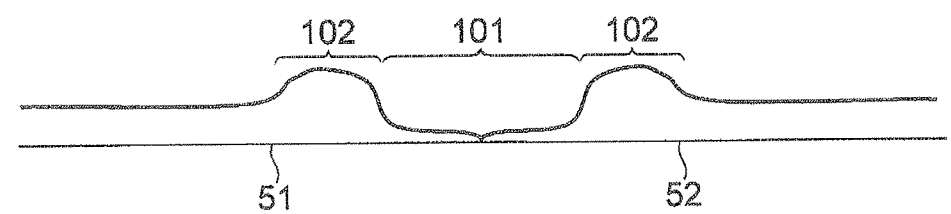
Figure 14:

Describing it in more detail, it is considered that the coating liquid in the peripheral portion 100 of the coating film, which has undergone wetting and spreading after being applied as shown in FIG. 14 (a), flows back toward the central portion 200 during the drying of the coating liquid as shown in FIG. 14 (b), whereby an extreme peripheral part 101 of the peripheral portion 100 becomes thinner while an inside part 102 thereof becomes thicker. For example, it is considered that as the film thickness of the coating liquid becomes larger, the width of constriction of the coating liquid from the peripheral portion 100 toward the central portion 200 during the drying increases, so as to result in a greater recession from an end 103 of coating position.

With occurrence of such film thickness variation in formation of the light emitting layer 50, the thickness-decreased part 101 becomes a bright line and the thickness-increased part 102 becomes a dark line. In the case where the light emitting layer in the light emitting region 51 is in contact with the light emitting layer in the light emitting region 52, i.e., in the case where the coating films (coating liquids) of the respective light emitting regions are in contact, at the boundary between the adjacent two light emitting regions 51, 52, as in the first embodiment, if the bright line caused by the thickness-decreased part 101 and the dark lines caused by the thickness-increased parts 102 are produced at the boundary between the two light emitting regions 51, 52 as shown in FIG. 14 (c) because of the foregoing film thickness variation, the boundary will be visually recognized as fringed and blurred.

Then, the seventh embodiment is configured so that, in the process of forming the light emitting layer, the coating liquid containing the light emitting material is applied to form a coating film in the film thickness of not less than 1 μm and not more than 6 μm and the coating film is solidified to form the light emitting layer.

When the film thickness of the coating film upon applying the coating liquid (before the solidification of the coating film) is set small, not less than 1 μm and not more than 6 μm, in this way, the constriction of the coating liquid from the peripheral portion toward the central portion is suppressed during the drying as shown in FIG. 14 (d), whereby the recession from the end of the coating position can be suppressed. Therefore, the thin film after the solidification can be made while suppressing the film thickness variation (thickness increase/thickness decrease) of the film thickness of the peripheral portion (end portion) relative to the film thickness of the central portion. As a result, the occurrence of the fringe at the boundary between the two light emitting regions 51, 52 can be suppressed, so as to improve the visibility.

The concept of the present invention can also be applied to the function films. For example, in forming the hole transport layer (function layer) 40D in the fifth embodiment, the hole transport layer 40D may be formed by applying the coating liquid containing the material constituting the hole transport layer 40D, to form the coating film in the film thickness of not less than 1 μm and not more than 6 μm, and solidifying the coating film, whereby the film thickness variation (thickness increase/thickness decrease) of the film thickness of the peripheral portion (end portion) relative to the film thickness of the central portion can be suppressed in the process of drying and solidifying the coating film, as described above, and, as a result, the occurrence of the fringe at the boundary between the two light emitting regions 51D, 52D can be suppressed, so as to improve the visibility.

Eighth Embodiment

The above-described seventh embodiment was configured with focus on the film thickness of the coating film, whereas the eighth embodiment is configured with focus on the viscosity of the coating liquid. As described above, it seems that the coating liquid in the peripheral portion 100 of the coating film, which has undergone wetting and spreading after being applied, flows back toward the central portion 200 during the drying of the coating liquid, whereby the extreme peripheral part 101 of the peripheral portion 100 becomes thinner and the inside part 102 thereof becomes thicker, and it seems that, for example, as the viscosity of the coating liquid becomes lower, the width of constriction of the coating liquid from the peripheral portion 100 toward the central portion 200 during the drying increases, so as to result in a greater recession from the end 103 of the coating position. In addition, a bulge (thickness increase) in the peripheral portion 100 is considered to be greater, too.

Then the eighth embodiment is configured in such a manner that, in formation of the light emitting layer, the coating liquid with the viscosity of not less than 7 cp and not more than 20 cp containing the light emitting material is applied to form a coating film and the coating film is solidified to form the light emitting layer.

When the viscosity of the coating liquid is set high, not less than 7 cp and not more than 20 cp, in this way, the flowage of the coating liquid from the peripheral portion toward the central portion during the drying can be suppressed so as to suppress the recession from the end of the coating position and further reduce the bulge (thickness increase) of the peripheral portion. Therefore, the thin film after the solidification can be made while suppressing the film thickness variation (thickness increase/thickness decrease) of the film thickness of the peripheral portion (end portion) relative to the central portion. As a result, the occurrence of the fringe at the boundary between the two light emitting regions 51, 52 can be suppressed, so as to improve the visibility.

The concept of the present invention can also be applied to the function films. For example, in forming the hole transport layer (function layer) 40D in the fifth embodiment, the hole transport layer 40D may be formed by applying the coating liquid with the viscosity of not less than 7 cp and not more than 20 cp containing the material constituting the hole transport layer 40D, to form a coating film and solidifying the coating film, whereby the film thickness variation (thickness increase/thickness decrease) of the film thickness of the peripheral portion (end portion) relative to the film thickness of the central portion can be suppressed, as described above, and, as a result, the occurrence of the fringe at the boundary between the two light emitting regions 51D, 52D can be suppressed, so as to improve the visibility.

The present invention can be modified in many ways without having to be limited to the above-described embodiments of the invention. For example, the embodiments of the invention exemplified the form wherein the light emitting layer had the two different light emitting regions, but the light emitting layer may have three or more different light emitting regions. The light emitting layer may be configured of a mixture of light emitting regions of different emission colors and light emitting regions of different emission luminances.

The embodiments of the invention exemplified the form wherein the hole injection layer 30, hole transport layer 40, and electron injection layer 60 were provided as the function layers, in addition to the pair of electrodes 20, 70 and the light emitting layer, but the features of the present invention can be applied to the organic EL elements of various configurations, as described below.

a) anode/light emitting layer/cathode
b) anode/hole injection layer/light emitting layer/cathode
c) anode/hole injection layer/light emitting layer/electron injection layer/cathode
d) anode/hole injection layer/light emitting layer/electron transport layer/electron injection layer/cathode
e) anode/hole injection layer/hole transport layer/light emitting layer/cathode
f) anode/hole injection layer/hole transport layer/light emitting layer/electron injection layer/cathode
g) anode/hole injection layer/hole transport layer/light emitting layer/electron transport layer/electron injection layer/cathode
h) anode/light emitting layer/electron injection layer/cathode
i) anode/light emitting layer/electron transport layer/electron injection layer/cathode Here, mark "/" indicates that the layers on both sides of mark "/" are stacked next to each other.

EXAMPLES

As Examples 1 to 3 of the present invention, the organic EL element 1A of the second embodiment shown in FIGS. 3 and 4, the organic EL element 1B of the third embodiment shown in FIGS. 5 and 6, and the organic EL element 1C of the fourth embodiment shown in FIGS. 7 and 8 were produced as described below.

Example 1

(Base Step)
First, a base substrate was prepared as one wherein the anode 20 was formed on the glass substrate 10. Specifically, a transparent electroconductive film of ITO (with the film thickness of 150 nm) was formed on the glass substrate 10 and thereafter a grid-like auxiliary electrode (with the line width 50 μm and pitch 300 μm) consisting of an APC (with the film thickness of 600 nm) was formed on the transparent electroconductive film. A protecting insulating film consisting of polyimide (Photoneece manufactured by Toray Industries, Inc.) was formed on the grid-like auxiliary electrode.

Next, a composition (ink) for the hole injection layer was applied onto the base substrate with the protecting insulating film by means of a spin coater and dried to form the hole injection layer 30 (in the film thickness of 65 nm).

Next, a composition (ink) for the hole transport layer was applied by means of the spin coater and dried and calcined at 10 Pa and 190° C. for 60 minutes by means of a vacuum dryer, to form the hole transport layer 40 (in the film thickness of 20 nm). The composition (ink) for the hole transport layer was one obtained by dissolving a polymer for the hole transport layer in a mixed solvent of 4-methoxy toluene and cyclohexylbenzene (at a mixture ratio of 2:8) so as to have a solid content concentration of 0.5%.

(Light Emitting Layer Step)
Next, the light emitting layer 50A was formed on the foregoing base. Specifically, using a polymer for emission as red ink for the light emitting region 51A (double-cross part), it was applied to the foregoing base by inkjet printing to form a thin film, the thin film was dried in vacuum to 10 Pa, and calcination was carried out at 130° C. for ten minutes. The composition for emission (red ink) was one obtained by dissolving the polymer for emission in a mixed solvent of 4-methoxy toluene and cyclohexylbenzene (at a mixture ratio of 2:8) so as to have a solid content concentration of 2.0%.

After that, using a polymer for emission of white for the light emitting region 52A (background part), it was applied by inkjet printing to form a thin film, the thin film was dried in vacuum to 10 Pa, and calcination was carried out at 130° C. for ten minutes. The composition for emission (white ink) was one obtained by dissolving the polymer for emission in a mixed solvent of 4-methoxy toluene and cyclohexylbenzene (at a mixture ratio of 2:8) so as to have a solid content concentration of 0.7%.

At this time, the inks were applied so that the inks for the respective light emitting regions overlapped by a designed value of about 0.3 mm, at the boundary between the light emitting region 51A and the light emitting region 52A.

(Post Step)

Next, the electron injection layer 60 and the cathode 70 were formed on the light emitting layer 50. Specifically, NaF/Mg/Al/Ag were evaporated by 2 nm/2 nm/200 nm/100 nm on the light emitting layer 50. Thereafter, the resultant was bonded to a counter substrate and the resulting lamination was divided.

Example 2

(Base Step)
The base step was the same as in the above-described Example 1.

(Light Emitting Layer Step)
Next, the light emitting layer 50B was formed on the aforementioned base. Specifically, using a polymer for emission as red ink for the light emitting region 51B (double-cross part), it was applied to the foregoing base by inkjet printing to form a thin film, the thin film was dried in vacuum to 10 Pa, and calcination was carried out at 130° C. for ten minutes. The composition for emission (red ink) was the same as in the above-described Example 1.

After that, using a polymer for emission of white for the light emitting region 52B (background part), it was applied by inkjet printing to form a thin film, the thin film was dried in vacuum to 10 Pa, and calcination was carried out at 130° C. for ten minutes. The composition for emission (white ink) was the same as in the above-described Example 1.

At this time, the inks were applied so that the light emitting region 51B was shifted by 2 mm in the direction along the light emission surface with respect to the light emitting region 52B.

(Post Step)
The post step was the same as in the above-described Example 1.

Example 3

(Base Step)
The base step was the same as in the above-described Example 1.

(Light Emitting Layer Step)
Next, the light emitting layer 50C was formed on the aforementioned base. Specifically, coating the foregoing base by inkjet printing was carried out by means of an inkjet printing device so that the light emitting region 51C (I-shaped part) was formed as a thin film area of 40 nm and the light emitting region 52C (background part) was formed as a thin film area of 60 nm, after vacuum drying to 10 Pa, and calcination was further carried out at 130° C. for ten minutes. A composition for emission (ink) was one obtained by dissolving a polymer for emission in a mixed solvent of 4-methoxy toluene and cyclohexylbenzene (at a mixture ratio of 2:8) so as to have a solid content concentration of 1.4%.

(Post Step)
The post step was the same as in the above-described Example 1.

Figure 13:
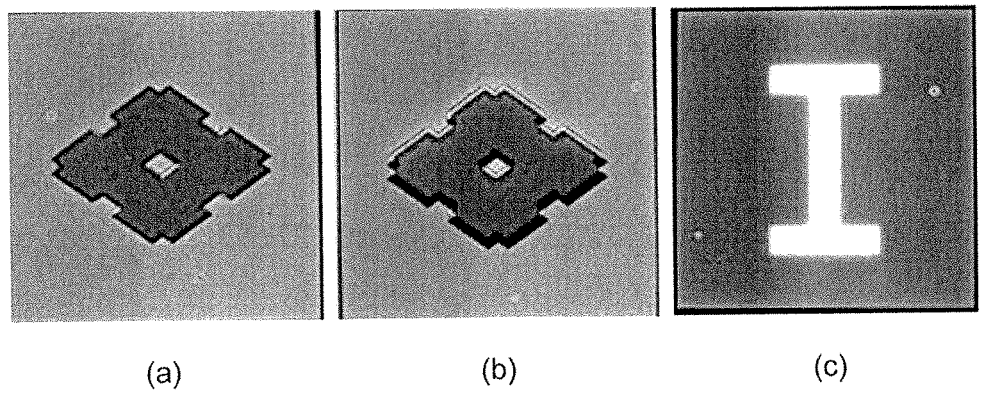
FIG. 13 (a) to (c) are the photographing results of light emission surfaces upon light emission of (a) Example 1, (b) Example 2, and (c) Example 3, respectively.

[Evaluation]
FIG. 13 (a) to (c) show the photographing results of the light emission surfaces upon emission of Examples 1 to 3, respectively. It is understood from FIGS. 13 (a) and (b) that when the light emitting regions 51A, 51B (double-cross part) and 52A, 52B (background part) in the light emitting layer are made different in their respective emission colors as in Examples 1 and 2, the predetermined emission pattern such a character or a picture can be formed. It is also understood from FIG. 13 (c) that when the light emitting regions 51C, 52C in the light emitting layer are made different in their respective emission luminances as in Example 3, the predetermined pattern such as a character or a picture can be formed.

It is understood from FIG. 13 (a) that in Example 1 the blur was successfully suppressed at the boundary between the light emitting region 51A (double-cross part) and the light emitting region 52A (background part). Furthermore, it is understood from FIG. 13 (b) that in Example 2 the three-dimensional visual effect was successfully achieved.

Next, produced as Example 11 of the present invention as described below was an equivalent of the organic EL element 1 of the first embodiment shown in FIGS. 1 and 2 with application of the light emitting layer forming method of the seventh embodiment, i.e., an equivalent of the organic EL element 1 wherein the film thickness of the coating film upon applying the coating liquid for the light emitting layer (before the solidification of the coating film) was small, not less than 1 μm and not more than 6 μm, and wherein the light emitting layer in the light emitting region 51 was in contact with the light emitting layer in the light emitting region 52 at the boundary between the adjacent two light emitting regions 51, 52, and Reference Examples 11 and 12 were produced as described below. FIG. 2 shows the red light emitting material and the blue light emitting material as the constituent materials of the light emitting layer 50, but it is noted that in the below forms the materials different from those in FIG. 2 may be used as the constituent materials of the light emitting layer in some cases. In the following, the base step and the post step are the same as in the above-described Example 1 and thus will be omitted from the description.

Example 11

(Light Emitting Layer Step)
The light emitting layer 50 was formed on the foregoing base. Specifically, coating the base was carried out by means of the inkjet printing device using a polymer yellow ink for emission for the light emitting region 51 (round part) and using a polymer blue ink for emission for the light emitting region 52 (background part) so as to form a thin film after vacuum drying to 10 Pa, and calcination was carried out at 130° C. for ten minutes.

The composition for emission (yellow ink) used herein was one obtained by dissolving the polymer for emission in a mixed solvent of 4-methoxy toluene and cyclohexylbenzene (at a mixture ratio of 2:8) so as to have a solid content concentration of 0.7%, and the viscosity thereof was controlled to 5 cp. The film thickness immediately after coating was controlled to 4.5 μm. The film thickness of the coating film immediately after coating is a value obtained by back calculation using the solid content concentration from a measurement of the film thickness after the drying with a stylus thickness meter (the same also applies to the below).

The composition for emission (blue ink) was one obtained by dissolving the polymer for emission in a mixed solvent of 4-methoxy toluene and cyclohexylbenzene (at a mixture ratio of 2:8) so as to have a solid content concentration of 1.0%, and the viscosity thereof was controlled to 8 cp. The film thickness immediately after coating was controlled to 2.4 μm.

Reference Example 11

It is the same as Example 11 except that the film thickness immediately after applying the yellow ink was 6.8 μm.

Reference Example 12

It is the same as Example 11 except that the film thickness immediately after applying the yellow ink was 9.1 μm and the film thickness immediately after applying the blue ink was 4.8

[Evaluation]

FIG. 15 shows the photographing results of the light emission surfaces upon emission of Example 11 and Reference Examples 11, 12. It is understood that in Reference Example 12 the film thickness of the coating film upon applying the yellow ink for the light emitting region 51 (round part) (before the solidification of the coating film) is large, 9.1 μm, whereby a bright line and a dark line appear at the boundary between the two light emitting regions 51, 52 to make a bright fringe visually recognized and that in Reference Example 11 the film thickness of the coating film upon applying the yellow ink for the light emitting region 51 (round part) (before the solidification of the coating film) is made relatively smaller, 6.8 μm, whereby the appearance of the bright line and the dark line at the boundary between the two light emitting regions 51, 52 is relatively suppressed, so as to restrain visibility of the fringe. It is further understood that in Example 11 the film thickness of the coating film upon applying the yellow ink for the light emitting region 51 (round part) (before the solidification of the coating film) is small, 4.5 μm, whereby the appearance of the bright line and the dark line at the boundary between the two light emitting regions 51, 52 is suppressed, so as to further restrain the visibility of the fringe.

Next, produced as Examples 21 and 22 of the present invention as described below were equivalents of the organic EL element 1 of the first embodiment shown in FIGS. 1 and 2 with application of the light emitting layer forming method of the seventh embodiment, i.e., equivalents of the organic EL element 1 wherein the film thickness of the coating film upon applying the coating liquid for the light emitting layer (before the solidification of the coating film) was small, not less than 1 μm and not more than 6 μm, and wherein the light emitting layer in the light emitting region 51 was in contact with the light emitting layer in the light emitting region 52 at the boundary between the adjacent two light emitting regions 51, 52, and Reference Example 21 was produced as described below. In the following, the base step and the post step are the same as in the above-described Example 1 and will be omitted from the description.

Example 21

(Light Emitting Layer Step)

The light emitting layer 50 was formed on the foregoing base. Specifically, coating the base was conducted by means of the inkjet printing device using a polymer purple ink for emission for the light emitting region 51 (spiral part) and using a polymer red ink for emission for the light emitting region 52 (background part) so as to form a thin film after vacuum drying to 10 Pa, and calcination was carried out at 130° C. for ten minutes.

The composition for emission (purple ink) was one obtained by dissolving the polymer for emission in a mixed solvent of 4-methoxy toluene and cyclohexylbenzene (at a mixture ratio of 2:8) so as to have a solid content concentration of 0.7%, and the viscosity thereof was controlled to 5 cp. The film thickness immediately after coating was controlled to 2.8 μm.

The composition for emission (red ink) was one obtained by dissolving the polymer for emission in a mixed solvent of 4-methoxy toluene and cyclohexylbenzene (at a mixture ratio of 2:8) so as to have a solid content concentration of 0.7%, and the viscosity thereof was controlled to 5 cp. The film thickness immediately after coating was controlled to 3.8 μm.

Example 22

It is the same as Example 21 except that the film thickness immediately after applying the red ink was 5.1 μm.

Reference Example 21

It is the same as Example 21 except that the film thickness immediately after applying the red ink was 6.4 μm.

[Evaluation]

FIG. 16 shows the photographing results of the light emission surfaces upon emission of Examples 21 and 22 and Reference Example 21. It is understood that in Reference Example 21 the film thickness of the coating film upon applying the red ink for the light emitting region 52 (background part) (before the solidification of the coating film) is large, 6.4 μm, whereby a bright line and a dark line appear at each boundary between the two light emitting regions 51, 52 to make a fringe visually recognized. In contrast to it, it is understood that in Examples 22 and 21 the film thickness of the coating film upon applying the red ink for the light emitting region 52 (background part) (before the solidification of the coating film) is made small, 5.1 μm or 3.8 μm, respectively, whereby the appearance of the bright line and the dark line at each boundary between the two light emitting regions 51, 52 is suppressed, so as to restrain the visibility of the fringe.

Next, produced as Examples 31 and 32 of the present invention as described below were equivalents of the organic EL element 1 of the first embodiment shown in FIGS. 1 and 2 with application of the light emitting layer forming method of the seventh embodiment, i.e., equivalents of the organic EL element 1 wherein the film thickness of the coating film upon applying the coating liquid for the light emitting layer (before the solidification of the coating film) was small, not less than 1 μm and not more than 6 μm, and wherein the light emitting layer in the light emitting region 51 was in contact with the light emitting layer in the light emitting region 52 at the boundary between the adjacent two light emitting regions 51, 52. In Example 32, the light emitting layer forming method of the eighth embodiment was also applied. In the following, the base step and the post step are the same as in the above-described Example 1 and will be omitted from the description.

Example 31

(Light Emitting Layer Step)

The light emitting layer 50 was formed on the foregoing base. Specifically, coating the base was conducted by means of the inkjet printing device using a polymer white ink for emission for the light emitting region 51 (snow mark part) and using a polymer blue ink for emission for the light emitting region 52 (background part) so as to form a thin film after vacuum drying to 10 Pa, and calcination was carried out at 130° C. for ten minutes.

The composition for emission (white ink) used was one obtained by dissolving the polymer for emission in a mixed solvent of 4-methoxy toluene and cyclohexylbenzene (at a mixture ratio of 2:8) so as to have a solid content concentration of 0.7%, and the viscosity thereof was controlled to 5 cp. The film thickness immediately after coating was controlled to 4.9 μm.

The composition for emission (blue ink) used was one obtained by dissolving the polymer for emission in a mixed solvent of 4-methoxy toluene and cyclohexylbenzene (at a mixture ratio of 2:8) so as to have a solid content concentration of 0.8%, and the viscosity thereof was controlled to 5 cp. The film thickness immediately after coating was controlled to 3.4 μm.

Example 32

It is the same as Example 31 except that the concentration of the white ink was 1.4%, the viscosity was 11 cp, and the film thickness after coating was 1.8 μm.
[Evaluation]

FIG. 17 shows the photographing results of the light emission surfaces upon emission of Examples 31 and 32. It is understood that in Examples 31 and 32 the film thickness of the coating film upon applying the blue ink for the light emitting region 52 (background part) (before the solidification of the coating film) is small, 3.4 μm, and the film thickness of the coating film upon applying the white ink for the light emitting region 51 (snow mark part) (before the solidification of the coating film) is small, 4.9 μm or 1.8 μm, respectively, whereby the appearance of the bright line and the dark line at the boundary between the two light emitting regions 51, 52 is suppressed, so as to restrain the visibility of the fringe. In Example 31 a slight dark line or fringe is visually recognized at the boundary between the two light emitting regions 51, 52. In contrast to it in Example 32 the viscosity of the white ink for the light emitting region 51 (snow mark part) was further increased to 11 cp, whereby the appearance of the dark line at the boundary between the two light emitting regions 51, 52 was more suppressed, so as to further restrain the visibility of the fringe.

INDUSTRIAL APPLICABILITY

The present invention is applicable to usage of the organic EL element and the organic EL element manufacturing method capable of achieving the simplification and cost reduction of the manufacturing method.

REFERENCE SIGNS LIST

1, 1A, 1B, 1C, 1D, or 1E organic EL element; 10 substrate; 20 anode (first electrode); 30 hole injection layer; 40 or 40D hole transport layer; 50, 50A, 50B, 50C, or 50E light emitting layer; 51, 52, 51A, 52A, 51B, 52B, 51C, 52C, 51D, or 52D light emitting region; 55 non-light-emitting region; 60 electron injection layer; 70 cathode (second electrode); 100 peripheral portion of coating film; 101 extreme peripheral part of peripheral portion of coating film; 102 inside part inside extreme peripheral part of peripheral portion of coating film; 103 end of coating film; 200 central portion of coating film.

The invention claimed is:

1. An organic EL element comprising: a continuous first electrode; a continuous second electrode; and a light emitting layer arranged between the first electrode and the second electrode,
   wherein the light emitting layer has a plurality of light emitting regions, and
   wherein adjacent light emitting regions out of the plurality of light emitting regions are different in at least one of emission color and emission luminance and thereby form a predetermined emission pattern showing a character or a picture,
   wherein out of the adjacent light emitting regions, a first light emitting region is arranged so as to be laminated with the second light emitting region on a one side of the first light emitting region in a predetermined direction.

2. The organic EL element according to claim 1, wherein the adjacent light emitting regions are different in light emitting materials contained in the light emitting layer in the respective light emitting regions.

3. The organic EL element according to claim 1, wherein the light emitting layer in a boundary region between the adjacent light emitting regions contains a light emitting material contained in the light emitting layer in the first light emitting region and a light emitting material contained in the light emitting layer in the second light emitting region.

4. The organic EL element according to claim 1, wherein the light emitting layer in a boundary region between the adjacent light emitting regions is even thinner than the thinner light emitting layer out of the light emitting layer in the first light emitting region and the light emitting layer in the second light emitting region.

5. The organic EL element according to claim 1, wherein the adjacent light emitting regions are different in thicknesses of the light emitting layer in the respective light emitting regions.

6. The organic EL element according to claim 1, further comprising: a function layer arranged between the first electrode and the second electrode and being different from the light emitting layer,
   wherein light emitting regions thicknesses of a first portion and a second portion of the function layer corresponding to the first and second light emitting regions are different.

7. The organic EL element according to claim 1, wherein the light emitting layer further has a non-light-emitting region,
   wherein the non-light-emitting region is formed by applying two types of coating liquids, wherein one of the two types of coating liquids is the same as the coating liquid for the light emitting layer in the light emitting region adjacent to the non-light-emitting region out of the plurality of light emitting regions, and wherein the other of the two types of coating liquids contains the same light emitting material as the light emitting material of the coating liquid for the light emitting layer in the light emitting region adjacent to the non-light-emitting region, or, contains a non-light-emitting material, and has a larger viscosity than the coating liquid for the light emitting layer in the light emitting region adjacent to the non-light-emitting region.

8. The organic EL element according to claim 1, wherein in a boundary region between the adjacent light emitting regions, the light emitting layer in the first light emitting region is in contact with the light emitting layer in the second light emitting region.

9. An organic EL element manufacturing method for manufacturing the organic EL element as defined in claim 1, comprising:
a step of forming the continuous first electrode;
a step of forming the light emitting layer having the plurality of light emitting regions so as to form a predetermined emission pattern showing a character or a picture by making the adjacent light emitting regions out of the plurality of light emitting regions different in at least one of emission color and emission luminance; and
a step of forming the continuous second electrode,
wherein in the step of forming the light emitting layer, out of the adjacent light emitting regions, a first light emitting region is arranged so as to be laminated with the second light emitting region on a one side of the first light emitting region in a predetermined direction.

10. The organic EL element manufacturing method according to claim 9, wherein the step of forming the light emitting layer comprises, with respect to the adjacent light emitting regions, applying coating liquids containing respective different light emitting materials in respective patterns to the respective light emitting regions to form coating films in patterns; and solidifying the coating films to form the light emitting layer in each of the light emitting regions.

11. The organic EL element manufacturing method according to claim 9, wherein the step of forming the light emitting layer comprises, in a boundary region between the adjacent light emitting regions, applying a coating liquid containing a light emitting material for the light emitting layer in the first light emitting region and applying a coating liquid containing a light emitting material for the light emitting layer in the second light emitting region.

12. The organic EL element manufacturing method according to claim 9, wherein a coating liquid containing a light emitting material is not applied in a boundary region between the adjacent light emitting regions in the step of forming the light emitting layer.

13. The organic EL element manufacturing method according to claim 9, wherein the step of forming the light emitting layer comprises, with respect to the adjacent light emitting regions, applying coating liquids containing respective light emitting materials in different coating amounts so that thicknesses of the light emitting layer in the respective light emitting regions are different.

14. The organic EL element manufacturing method according to claim 9, further having a step of forming a function layer different from the light emitting layer, between the first electrode and the second electrode, wherein the step of forming the function layer comprises, with respect to the adjacent light emitting regions, applying a coating liquid containing a material constituting the function layer in different coating amounts so that thicknesses of a first portion and a second portion of the function layer corresponding to the first and second light emitting regions are different, to form a coating film; and solidifying the coating film to form the function layer.

15. The organic EL element manufacturing method according to claim 9,
wherein the step of forming the light emitting layer includes a sub-step of forming a non-light-emitting region in the light emitting layer, and
wherein the sub-step of forming the non-light-emitting region comprises: applying a coating liquid which contains the same light emitting material as the light emitting material of the coating liquid for the light emitting layer in the light emitting region adjacent to the non-light-emitting region out of the plurality of light emitting regions, or, which contains a non-light-emitting material, and which has a larger viscosity than the coating liquid for the light emitting layer in the light emitting region adjacent to the non-light-emitting region; and thereafter applying the same coating liquid as the coating liquid for the light emitting layer in the light emitting region adjacent to the non-light-emitting region.

16. The organic EL element manufacturing method according to claim 9, wherein the step of forming the light emitting layer comprises, with respect to a boundary region between the adjacent light emitting regions, applying a coating liquid so that the light emitting layer in the first light emitting region is in contact with the light emitting layer in the second light emitting region.

17. The organic EL element manufacturing method according to claim 9, wherein the step of forming the light emitting layer comprises: applying a coating liquid containing a light emitting material to form a coating film in a film thickness of not less than 1 µm and not more than 6 µm; and solidifying the coating film to form the light emitting layer.

18. The organic EL element manufacturing method according to claim 9, wherein the step of forming the light emitting layer comprises; applying a coating liquid with a viscosity of not less than 7 cp and not more than 20 cp containing a light emitting material to form a coating film; and solidifying the coating film to form the light emitting layer.

19. The organic EL element manufacturing method according to claim 14, wherein the step of forming the function film comprises; applying a coating liquid containing a material constituting the function layer to form a coating film in a film thickness of not less than 1 µm and not more than 6 µm; and solidifying the coating film to form the function layer.

20. The organic EL element manufacturing method according to claim 14, wherein the step of forming the function layer comprises; applying a coating liquid with a viscosity of not less than 7 cp and not more than 20 cp containing a material constituting the function layer to form a coating film; and solidifying the coating film to form the function layer.

21. The organic EL element manufacturing method according to claim 10, wherein a method for applying the coating liquid is an inkjet printing method.

22. The organic EL element according to claim 1,
wherein the first light emitting region is arranged so as to be surrounded by the second light emitting region and to be offset with respect to the second light emitting region.

23. The organic EL element manufacturing method according to claim 9,
wherein in the step of forming the light emitting layer, the first light emitting region is arranged so as to be surrounded by the second light emitting region and to be offset with respect to the second light emitting region.

24. An organic EL element comprising: a continuous first electrode; a continuous second electrode; and a light emitting layer arranged between the first electrode and the second electrode,
wherein the light emitting layer has a plurality of light emitting regions,
wherein at least two light emitting regions out of the plurality of light emitting regions are different in at least one of emission color and emission luminance,
wherein the light emitting layer further has a non-light-emitting region,
wherein the non-light-emitting region is formed by applying two types of coating liquids,
wherein one of the two types of coating liquids is the same as the coating liquid for the light emitting layer in the light emitting region adjacent to the non-light-emitting region out of the plurality of light emitting regions, and
wherein the other of the two types of coating liquids contains the same light emitting material as the light emitting material of the coating liquid for the light emitting layer in the light emitting region adjacent to the non-light-emitting region, or, contains a non-light-emitting material, and has a larger viscosity than the coating liquid for the light emitting layer in the light emitting region adjacent to the non-light-emitting region.

25. An organic EL element manufacturing method for manufacturing the organic EL element comprising a continuous first electrode, a continuous second electrode and a light emitting layer arranged between the first electrode and the second electrode, wherein the light emitting layer has a plurality of light emitting regions, and
wherein at least two light emitting regions out of the plurality of light emitting regions are different in at least one of emission color and emission luminance, the method comprising:
a step of forming the continuous first electrode;
a step of forming the light emitting layer having the plurality of light emitting regions, at least two light emitting regions out of the plurality of light emitting regions being different in at least one of emission color and emission luminance; and
a step of forming the continuous second electrode, wherein the step of forming the light emitting layer includes a sub-step of forming a non-light-emitting region in the light emitting layer, and
wherein the sub-step of forming the non-light-emitting region comprises: applying a coating liquid which contains the same light emitting material as the light emitting material of the coating liquid for the light emitting layer in the light emitting region adjacent to the non-light-emitting region out of the plurality of light emitting regions, or, which contains a non-light-emitting material, and which has a larger viscosity than the coating liquid for the light emitting layer in the light emitting region adjacent to the non-light-emitting region; and thereafter applying the same coating liquid as the coating liquid for the light emitting layer in the light emitting region adjacent to the non-light-emitting region.

26. An organic EL element manufacturing method for manufacturing the organic EL element comprising a continuous first electrode, a continuous second electrode; and a light emitting layer arranged between the first electrode and the second electrode, wherein the light emitting layer has a plurality of light emitting regions, and wherein at least two light emitting regions out of the plurality of light emitting regions are different in at least one of emission color and emission luminance and thereby form a predetermined emission pattern showing a character or a picture, the method comprising:
a step of forming the continuous first electrode;
a step of forming the light emitting layer having the plurality of light emitting regions so as to form a predetermined emission pattern showing a character or a picture by making at least two light emitting regions out of the plurality of light emitting regions different in at least one of emission color and emission luminance; and
a step of forming the continuous second electrode,
wherein the step of forming the light emitting layer comprises, with respect to at least two light emitting regions out of the plurality of light emitting regions, applying coating liquids containing respective different light emitting materials in respective patterns to the respective light emitting regions to form coating films in patterns; and solidifying the coating films to form the light emitting layer in each of the light emitting regions.

27. An organic EL element manufacturing method for manufacturing the organic EL element comprising a continuous first electrode, a continuous second electrode; and a light emitting layer arranged between the first electrode and the second electrode, wherein the light emitting layer has a plurality of light emitting regions, and wherein at least two light emitting regions out of the plurality of light emitting regions are different in at least one of emission color and emission luminance and thereby form a predetermined emission pattern showing a character or a picture, the method comprising:
a step of forming the continuous first electrode;
a step of forming the light emitting layer having the plurality of light emitting regions so as to form a predetermined emission pattern showing a character or a picture by making at least two light emitting regions out of the plurality of light emitting regions different in at least one of emission color and emission luminance; and
a step of forming the continuous second electrode,
wherein the step of forming the light emitting layer comprises, in a boundary region between adjacent light emitting regions, applying a coating liquid containing a light emitting material for the light emitting layer in one light emitting region of the adjacent light emitting regions and applying a coating liquid containing a light emitting material for the light emitting layer in the other light emitting region of the adjacent light emitting regions.

28. An organic EL element manufacturing method for manufacturing the organic EL element comprising a continuous first electrode, a continuous second electrode; and a light emitting layer arranged between the first electrode and the second electrode, wherein the light emitting layer has a plurality of light emitting regions, and wherein at least two light emitting regions out of the plurality of light emitting regions are different in at least one of emission color and emission luminance and thereby form a predetermined emission pattern showing a character or a picture, the method comprising:
  a step of forming the continuous first electrode;
    a step of forming the light emitting layer having the plurality of light emitting regions so as to form a predetermined emission pattern showing a character or a picture by making at least two light emitting regions out of the plurality of light emitting regions different in at least one of emission color and emission luminance; and
    a step of forming the continuous second electrode,
    wherein a coating liquid containing a light emitting material is not applied in a boundary region between the adjacent light emitting regions out of the plurality of light emitting regions in the step of forming the light emitting layer.

29. An organic EL element manufacturing method for manufacturing the organic EL element comprising a continuous first electrode, a continuous second electrode; and a light emitting layer arranged between the first electrode and the second electrode, wherein the light emitting layer has a plurality of light emitting regions, and wherein at least two light emitting regions out of the plurality of light emitting regions are different in at least one of emission color and emission luminance and thereby form a predetermined emission pattern showing a character or a picture, the method comprising:
  a step of forming the continuous first electrode;
  a step of forming the light emitting layer having the plurality of light emitting regions so as to form a predetermined emission pattern showing a character or a picture by making at least two light emitting regions out of the plurality of light emitting regions different in at least one of emission color and emission luminance; and
  a step of forming the continuous second electrode,
  wherein the step of forming the light emitting layer comprises, with respect to at least two light emitting regions out of the plurality of light emitting regions, applying coating liquids containing respective light emitting materials in different coating amounts so that thicknesses of the light emitting layer in the respective light emitting regions are different.

30. An organic EL element manufacturing method for manufacturing the organic EL element comprising a continuous first electrode, a continuous second electrode; and a light emitting layer arranged between the first electrode and the second electrode, wherein the light emitting layer has a plurality of light emitting regions, and wherein at least two light emitting regions out of the plurality of light emitting regions are different in at least one of emission color and emission luminance and thereby form a predetermined emission pattern showing a character or a picture, the method comprising:
  a step of forming the continuous first electrode;
  a step of forming the light emitting layer having the plurality of light emitting regions so as to form a predetermined emission pattern showing a character or a picture by making at least two light emitting regions out of the plurality of light emitting regions different in at least one of emission color and emission luminance; and
  a step of forming the continuous second electrode,
  wherein the method further has a step of forming a function layer different from the light emitting layer, between the first electrode and the second electrode,
  wherein the step of forming the function layer comprises, with respect to at least two light emitting regions out of the plurality of light emitting regions, applying a coating liquid containing a material constituting the function layer in different coating amounts so that thicknesses of portions of the function layer corresponding to the respective light emitting regions are different, to form a coating film; and solidifying the coating film to form the function layer.

31. An organic EL element manufacturing method for manufacturing the organic EL element comprising a continuous first electrode, a continuous second electrode; and a light emitting layer arranged between the first electrode and the second electrode, wherein the light emitting layer has a plurality of light emitting regions, and wherein at least two light emitting regions out of the plurality of light emitting regions are different in at least one of emission color and emission luminance and thereby form a predetermined emission pattern showing a character or a picture, the method comprising:
  a step of forming the continuous first electrode;
  a step of forming the light emitting layer having the plurality of light emitting regions so as to form a predetermined emission pattern showing a character or a picture by making at least two light emitting regions out of the plurality of light emitting regions different in at least one of emission color and emission luminance; and
  a step of forming the continuous second electrode,
  wherein in the step of forming the light emitting layer, out of the at least two light emitting regions, a first light emitting region is arranged so as to be surrounded by a second light emitting region and to be offset with respect to the second light emitting region.

* * * * *